(12) United States Patent
Obata

(10) Patent No.: US 9,048,806 B2
(45) Date of Patent: Jun. 2, 2015

(54) SURFACE ACOUSTIC WAVE DEVICE, ELECTRONIC APPARATUS, AND SENSOR APPARATUS

(75) Inventor: Naohisa Obata, Suwa (JP)

(73) Assignee: Seiko Epson Corporation (JP)

( * ) Notice: Subject to any disclaimer, the term of this patent is extended or adjusted under 35 U.S.C. 154(b) by 587 days.

(21) Appl. No.: 13/223,405

(22) Filed: Sep. 1, 2011

(65) Prior Publication Data

US 2012/0068573 A1   Mar. 22, 2012

(30) Foreign Application Priority Data

Sep. 9, 2010   (JP) ................................ 2010-201751

(51) Int. Cl.
| H03H 9/19 | (2006.01) |
| H01L 41/18 | (2006.01) |
| H03H 9/05 | (2006.01) |
| H03H 9/02 | (2006.01) |
| H03H 9/145 | (2006.01) |

(52) U.S. Cl.
CPC ......... *H03H 9/02551* (2013.01); *H03H 9/0542* (2013.01); *H03H 9/14594* (2013.01)

(58) Field of Classification Search
USPC ...................................... 310/313 A, 360, 361
See application file for complete search history.

(56) References Cited

U.S. PATENT DOCUMENTS

| 382,217 A | 5/1888 | Davies |
| 4,130,813 A | 12/1978 | Sandy et al. |
| 4,387,355 A | 6/1983 | Uno et al. |
| 5,179,310 A | 1/1993 | Satoh et al. |
| 5,757,250 A | 5/1998 | Ichikawa et al. |
| 5,895,996 A | 4/1999 | Takagi et al. |
| 6,154,105 A | 11/2000 | Fujimoto et al. |
| 6,329,888 B1 | 12/2001 | Hirota |

(Continued)

FOREIGN PATENT DOCUMENTS

| CN | 1336036 A | 2/2002 |
| CN | 1434568 A | 8/2003 |

(Continued)

OTHER PUBLICATIONS

Takehiko Uno, Nobuhide Miyamoto and Hiroshi Abe (Electrical Communication Laboratories, NTT), "Fabrication of SAW Resonators with Groove Gratings and their Characteristics", (Oct. 18, 1982) (pp. 45-52) with English translation.
Extended European Search Report for Application No. EP 10 15 4829 mailed Mar. 15, 2013 (6 pages).
Extended European Search Report for Application No. EP 10 74 6022 mailed Mar. 15, 2013 (6 pages).

(Continued)

*Primary Examiner* — Thomas Dougherty
(74) *Attorney, Agent, or Firm* — Harness, Dickey & Pierce, P.L.C.

(57) ABSTRACT

A SAW device includes an IDT which is provided on the principal surface of a quartz crystal substrate having Euler angles ($-1.5°\leq\phi\leq1.5°$, $117°\leq\theta\leq142°$, $|\psi|\neq90°\times n$ (where n=0, 1, 2, 3)) and excites a Rayleigh wave (wavelength: $\lambda$) in a stopband upper end mode. Inter-electrode-finger grooves are recessed between electrode fingers of the IDT. An IDT line occupancy $\eta$ and an inter-electrode-finger groove depth G satisfy a predetermined relationship in terms of the wavelength $\lambda$, such that the SAW device has a frequency-temperature characteristic of a cubic curve having an inflection point between a maximum value and a minimum value in an operation temperature range. The inflection point is adjustable to a desired temperature or a desired temperature range depending on the IDT line occupancy $\eta$ within an operation temperature range.

22 Claims, 11 Drawing Sheets

(56) References Cited

U.S. PATENT DOCUMENTS

| | | |
|---|---|---|
| 6,414,414 B1 | 7/2002 | Wright |
| 6,674,215 B1 | 1/2004 | Yoshida et al. |
| 6,774,747 B2 | 8/2004 | Yamazaki et al. |
| 6,784,595 B2 | 8/2004 | Iizawa et al. |
| 6,856,218 B2 | 2/2005 | Yamazaki et al. |
| 6,946,930 B2 | 9/2005 | Kadota et al. |
| 7,027,921 B2* | 4/2006 | Kalantar-Zadeh et al. ....... 702/2 |
| 7,135,805 B2 | 11/2006 | Yamanouchi |
| 7,315,805 B2 | 1/2008 | Slater |
| 7,352,104 B2 | 4/2008 | Yamazaki et al. |
| 7,382,217 B2 | 6/2008 | Morita et al. |
| 7,589,451 B2 | 9/2009 | Morita et al. |
| 7,696,675 B2 | 4/2010 | Kanna |
| 8,063,534 B2 | 11/2011 | Iizawa |
| 8,084,918 B2 | 12/2011 | Iizawa |
| 8,237,326 B2 | 8/2012 | Iizawa |
| 8,305,162 B2 | 11/2012 | Yamanaka |
| 8,502,625 B2 | 8/2013 | Yamanaka |
| 8,598,766 B2 | 12/2013 | Owaki et al. |
| 2002/0171512 A1 | 11/2002 | Kadota et al. |
| 2003/0030513 A1 | 2/2003 | Yamazaki et al. |
| 2003/0052572 A1* | 3/2003 | Iizawa et al. ............... 310/313 A |
| 2003/0111931 A1 | 6/2003 | Suzuki et al. |
| 2003/0146810 A1 | 8/2003 | Yamazaki et al. |
| 2003/0168932 A1 | 9/2003 | Shibata et al. |
| 2004/0135469 A1* | 7/2004 | Kanna ........................ 310/313 A |
| 2004/0174233 A1 | 9/2004 | Takayama et al. |
| 2004/0201306 A1 | 10/2004 | Yamanouchi |
| 2005/0122179 A1* | 6/2005 | Ogiso ........................ 331/107 A |
| 2005/0127781 A1 | 6/2005 | Yamazaki et al. |
| 2005/0168302 A1 | 8/2005 | Orito et al. |
| 2006/0108894 A1* | 5/2006 | Kanna ........................ 310/313 A |
| 2006/0145568 A1 | 7/2006 | Morita et al. |
| 2007/0103038 A1 | 5/2007 | Kamijo |
| 2007/0182278 A1* | 8/2007 | Kanna ........................ 310/313 A |
| 2007/0296522 A1 | 12/2007 | Takamine |
| 2008/0067891 A1 | 3/2008 | Matsuda et al. |
| 2008/0079512 A1 | 4/2008 | Nakazawa et al. |
| 2008/0084134 A1 | 4/2008 | Morita et al. |
| 2009/0021108 A1 | 1/2009 | Owaki et al. |
| 2009/0206955 A1 | 8/2009 | Iizawa |
| 2010/0001617 A9 | 1/2010 | Kanna |
| 2010/0219913 A1 | 9/2010 | Yamanaka |
| 2010/0244626 A1 | 9/2010 | Yamanaka |
| 2011/0199163 A1 | 8/2011 | Yamanaka |
| 2011/0309897 A1* | 12/2011 | Yamanaka .................... 333/195 |
| 2012/0049969 A1 | 3/2012 | Owaki et al. |
| 2012/0049979 A1* | 3/2012 | Owaki et al. ................. 333/195 |
| 2012/0062069 A1 | 3/2012 | Yamanaka |
| 2012/0062070 A1 | 3/2012 | Yamanaka et al. |
| 2012/0062329 A1* | 3/2012 | Yamanaka .................... 331/158 |
| 2012/0068573 A1 | 3/2012 | Obata |
| 2012/0086308 A1* | 4/2012 | Obata et al. ............... 310/313 A |
| 2012/0139652 A1* | 6/2012 | Yamanaka .................... 331/158 |
| 2012/0212301 A1 | 8/2012 | Yamanaka |
| 2012/0223411 A1* | 9/2012 | Cho et al. ...................... 257/531 |
| 2013/0027147 A1 | 1/2013 | Yamanaka |
| 2014/0055207 A1 | 2/2014 | Owaki et al. |

FOREIGN PATENT DOCUMENTS

| | | |
|---|---|---|
| CN | 1619956 A | 5/2005 |
| CN | 101820265 A | 9/2010 |
| JP | 54-156455 A | 12/1979 |
| JP | 57-005418 | 1/1982 |
| JP | 57-099813 | 6/1982 |
| JP | 58-033309 A | 2/1983 |
| JP | 61-092011 | 5/1986 |
| JP | 63-088910 | 4/1988 |
| JP | 64-068114 A | 3/1989 |
| JP | 1-34411 | 7/1989 |
| JP | 01-231412 | 9/1989 |
| JP | 02-189011 | 7/1990 |
| JP | 05-090865 | 4/1993 |
| JP | 08-307190 | 11/1996 |
| JP | 10-270974 | 10/1998 |
| JP | 11-214958 A | 8/1999 |
| JP | 11-298290 A | 10/1999 |
| JP | 2000-188521 A | 7/2000 |
| JP | 2000-216632 A | 8/2000 |
| JP | 3216137 | 8/2001 |
| JP | 3216137 B2 | 10/2001 |
| JP | 3266846 | 1/2002 |
| JP | 2002-100959 | 4/2002 |
| JP | 03-284009 B2 | 5/2002 |
| JP | 2002-517933 A | 6/2002 |
| JP | 2002-330051 A | 11/2002 |
| JP | 2003-124780 A | 4/2003 |
| JP | 2003-152487 A | 5/2003 |
| JP | 2003-188675 A | 7/2003 |
| JP | 2003-258601 A | 9/2003 |
| JP | 2003-283282 | 10/2003 |
| JP | 2005-012736 A | 1/2005 |
| JP | 2005-204275 | 7/2005 |
| JP | 2006-013576 | 1/2006 |
| JP | 2006-074136 A | 3/2006 |
| JP | 2006-148622 | 6/2006 |
| JP | 2006-186623 A | 7/2006 |
| JP | 2006-203408 | 8/2006 |
| JP | 2006-295311 A | 10/2006 |
| JP | 3851336 | 11/2006 |
| JP | 2006-339742 A | 12/2006 |
| JP | 2007-028664 A | 2/2007 |
| JP | 2007-074754 A | 3/2007 |
| JP | 3897229 B2 | 3/2007 |
| JP | 2007-093213 A | 4/2007 |
| JP | 2007-134932 A | 5/2007 |
| JP | 2007-142794 A | 6/2007 |
| JP | 2007-208871 | 8/2007 |
| JP | 2007-259414 A | 10/2007 |
| JP | 2007-267033 | 10/2007 |
| JP | 2007-281701 A | 10/2007 |
| JP | 2007-300174 A | 11/2007 |
| JP | 2007-300287 | 11/2007 |
| JP | 2007-333500 A | 12/2007 |
| JP | 2008-005151 A | 1/2008 |
| JP | 2008-078739 A | 4/2008 |
| JP | 2008-078984 A | 4/2008 |
| JP | 2008-092017 A | 4/2008 |
| JP | 2008-177886 A | 7/2008 |
| JP | 2008-236295 A | 10/2008 |
| JP | 2008-278349 A | 11/2008 |
| JP | 2008-286520 A | 11/2008 |
| JP | 2008-286521 A | 11/2008 |
| JP | 2009-225420 | 10/2009 |
| JP | 2010-016523 A | 1/2010 |
| JP | 2010-233203 A | 10/2010 |
| JP | 05-007124 B2 | 8/2012 |
| WO | WO 2005/099089 | 10/2005 |
| WO | WO-2006-137464 A1 | 12/2006 |
| WO | WO-2010-047114 A1 | 4/2010 |
| WO | WO-2010-098139 A1 | 9/2010 |

OTHER PUBLICATIONS

K. Yamanaka et al., "High-Stability Saw Oscillators With Cubic Frequency Temperature Curve and Excellent Aging Characteristics", 2010 IEEE International Ultrasonics Symposium Proceedings, pp. 868-871 and 1 page IEEE Xplore abstract, conference date Oct. 11-14, 2010.

S. Kanna et al., "Temperature Stability of Surface Acoustic Wave Resonators on the In-Plane Rotated 33 Degree Y-Cut Quartz", 2002 IEEE Ultrasonics Symposium Proceedings, vol. 1, pp. 101-104 and 1 page IEEE Xplore abstract, conference date Oct. 8-11, 2002.

Shigeo Kanna, Yook-Kong Yong (The Institute of Electronics, Information and Communication Engineers), "Frequency-Temperature Analysis of Surface Acoustic Waves Using Finite Element Method", (Jun. 1999) (pp. 37-42) with English Translation.

Shimizu, Yasutaka et al., "A New Cut of Quartz for Saw With More Stable Temperature Characteristics", Tokyo Insitute of Technology, Nippon Electric Co., Ltd., Mar. 26, 1982, pp. 558-564.

* cited by examiner $\eta = L/(L+S)$

SURFACE ACOUSTIC WAVE DEVICE, ELECTRONIC APPARATUS, AND SENSOR APPARATUS

TECHNICAL FIELD

The present invention relates to a surface acoustic wave device, such as a resonator or an oscillator using a surface acoustic wave (SAW), and an electronic apparatus and a sensor apparatus including the same.

RELATED ART

SAW devices are widely used in electronic apparatuses, such as a mobile phone, a hard disk, a personal computer, a receiver tuner of BS and CS broadcasts, an apparatus which processes a high-frequency signal or an optical signal propagating through a coaxial cable or an optical cable, a server network apparatus which requires a high-frequency and high-precision clock (low jitter and low phase noise) in a wide temperature range, and a wireless communication apparatus, or various sensor apparatuses, such as a pressure sensor, an acceleration sensor, and a rotational speed sensor. In these apparatuses and devices, in particular, with the realization of a high-frequency reference clock due to recent high-speed performance of information communication or the reduction in the size of the apparatus casing, there is an increasing influence of heat generation inside the apparatus. For this reason, with regard to an electronic device which is mounted in the apparatus, expansion or high-precision performance of an operation temperature range is required. A stable operation is required over a long period in an environment in which there is a severe change in the temperature from a low temperature to a high temperature, like a wireless base station outdoors.

In general, in a SAW device, such as a SAW resonator, a change in the frequency-temperature characteristic is significantly influenced by the SAW stopband, the cut angle of a quartz crystal substrate to be used, the form of an IDT (interdigital transducer) formed on the substrate, or the like. For example, a reflection inverting-type SAW converter is suggested in which an IDT having a unit segment repeatedly arranged on a piezoelectric substrate is provided, the unit segment having three electrode fingers per SAW wavelength, and the upper mode and lower mode of the SAW stopband are excited (for example, see Japanese Patent No. 3266846). If a SAW filter is constituted by the reflection inverting-type SAW converter, it is possible to realize a high attenuation amount in a blocked band on a high-frequency band side near a passband.

A reflection inverting-type SAW converter is known in which a so-called ST cut quartz crystal substrate having Euler angles (φ, θ, ψ)=(0°, 123°, 0°) is used (for example, see JP-A-2002-100959). JP-A-2002-100959 describes that the resonance of the upper end of the stopband can be excited, and the frequency-temperature characteristic is improved compared to a case where the resonance of the lower end of the stopband is used. It is reported that the upper end of the SAW stopband has a satisfactory frequency-temperature characteristic compared to the lower end of the stopband (for example, see JP-A-2006-148622, JP-A-2007-208871, JP-A-2007-267033, and JP-A-2007-300287).

In particular, JP-A-2006-148622 and JP-A-2007-208871 describe a technique which adjusts the cut angle of the quartz crystal substrate and thickens the standardized thickness (H/λ) of an IDT electrode to about 0.1 so as to obtain a satisfactory frequency-temperature characteristic in a SAW device using a Rayleigh wave. A SAW resonator described in JP-A-2006-148622 has a single-type IDT electrode in which a unit segment having two electrode fingers per SAW wavelength is repeatedly arranged on a quartz crystal substrate having Euler angles (φ, θ, ψ)=(φ=0°, 0°≤θ≤180°, 0°<|ψ|<90°). Thus, the Rayleigh wave is excited in the stopband upper limit mode, thereby realizing high-frequency performance and a satisfactory frequency-temperature characteristic of a SAW resonator.

JP-A-2007-208871 describes a technique which, in a SAW device which has the single-type IDT electrode, sets a quartz crystal substrate at Euler angles (φ, θ, ψ)=(φ=0°, 110°≤θ≤140°, 38°≤|ψ|≤44°), and sets the relationship between the standardized electrode thickness (H/λ) and the standardized electrode width η (=d/P) defined by the thickness H of the IDT electrode, the width d of an electrode finger in the IDT electrode, the pitch P between electrode fingers in the IDT electrode, and the SAW wavelength λ as follows.

$$H/\lambda \geq 0.1796\eta^3 - 0.4303\eta^2 + 0.2071\eta + 0.0682$$

Thus, it is possible to strongly excite the Rayleigh wave in the stopband upper limit mode.

JP-A-2007-267033 describes a SAW element in which a single-type IDT electrode is arranged on a quartz crystal substrate having Euler angles (φ, θ, ψ)=(0°, θ, 9°<|ψ|<46°), preferably, (0°, 95°<θ<155°, 33°<|ψ|<46°), and the standardized electrode thickness (H/λ) is 0.045≤H/λ≤0.085. Thus, the Rayleigh wave is excited in the stopband upper limit mode, thereby realizing a satisfactory frequency-temperature characteristic.

JP-A-2007-300287 describes a SAW element in which the single-type IDT electrode is arranged on an in-plane rotation ST cut quartz crystal substrate having Euler angles (φ, θ, ψ)=(0°, 123°, 43.2°), and the standardized electrode thickness (H/λ) is H/λ=0.06, so-called 6% λ, thereby exciting the Rayleigh wave in the stopband upper limit mode. The SAW element sets the standardized electrode width η (=Lt/Pt) defined by the electrode finger width Lt of the IDT electrode and the electrode finger pitch Pt to 0.51≤η≤0.7, thereby realizing a frequency deviation of maximum 830 ppm at normal temperature (25° C.).

A SAW resonator is also known in which grooves are formed in the surface of a quartz crystal substrate between electrode fingers constituting an IDT and between conductor strips constituting a reflector (for example, see JP-B-2-7207 (JP-A-57-5418) and Manufacturing Conditions and Characteristics of Groove-type SAW Resonator (IECE, Technical Research Report MW82-59 (1982))). JP-B-2-7207 (JP-A-57-5418) describes a SAW resonator in which an IDT and a reflector are formed of aluminum electrodes on an ST cut X-propagation quartz crystal substrate, and grooves are formed in the corresponding regions between electrode fingers constituting the IDT and between conductor strips (electrode fingers) constituting the reflector, thereby realizing a high Q value, a low capacitance ratio, and low resonance resistance. JP-B-2-7207 (JP-A-57-5418) describes a structure in which the groove of the IDT and the groove of the reflector have the same depth and a structure in which the groove of the reflector is greater in depth than the groove of the IDT.

Manufacturing Conditions and Characteristics of Groove-type SAW Resonator (Manufacturing Conditions and Characteristics of Groove-type SAW Resonator (IECE, Technical Research Report MW82-59 (1982))) describes the characteristic of a groove-type SAW resonator using an ST cut quartz crystal substrate. It has been reported that the frequency-temperature characteristic changes depending on the depth of the grooves formed in a quartz crystal surface uncovered with the electrodes of the SAW propagation substrate, and as the depth of the grooves increases, the peak temperature Tp of an upward convex quadratic curve decreases.

A method which forms grooves in a piezoelectric substrate, such as quartz crystal, to adjust an effective thickness and to adjust a frequency is well known to those skilled in the art (for example, see JP-A-2-189011, JP-A-5-90865, JP-A-1-231412, and JP-A-61-92011). In a SAW device described in JP-A-2-189011, the surface of the piezoelectric substrate having an IDT formed thereon is etched under the condition that the etching rate of the piezoelectric substrate is greater than the etching rate of the IDT, and fine adjustment is performed to lower the frequency. In JP-A-5-90865, JP-A-1-231412, and JP-A-61-92011, similarly, the surface of a piezoelectric substrate is dry-etched with the IDT formed thereon as a mask, such that the frequency of the SAW device is shifted to a low-frequency band.

In a transversal SAW filter, a technique is known in which the surface of a piezoelectric substrate between electrode fingers of an IDT electrode is etched to form grooves, thereby reducing an apparent propagation speed (for example, see JP-A-10-270974). Thus, it is possible to make the electrode finger pitch of the IDT electrode small without changing the preliminary design of the SAW filter, thereby realizing reduction in size of a chip.

In a SAW resonator which excites a shear wave called an SSBW (Surface Skimming Bulk Wave), it is known that an IDT electrode having a standardized electrode thickness (H/λ) of 2.0≤H/λ≤4.0% is formed of aluminum on a rotation Y cut quartz crystal substrate in which a cut angle is −43° to −52° and a shear wave propagation direction is a Z'-axis direction (Euler angles (φ, θ, ψ)=(0°, 38≤θ≤47, 90°), thereby realizing a frequency-temperature characteristic of a cubic curve (for example, see JP-B-1-34411). A shear wave (SH wave) propagates directly below the surface of the piezoelectric substrate in a state where vibration energy is confined directly below the electrode. Thus, the reflection efficiency of the SAW by the reflector is unsatisfactory compared to an ST cut quartz crystal SAW device in which a SAW propagates along the substrate surface, making it difficult to realize reduction in size and a high Q value.

In order to solve this problem, a SAW device is suggested in which an IDT and a grating reflector are formed in the surface of a rotation Y cut quartz crystal substrate having Euler angles (φ, θ, ψ)=(0°, −64°<θ<−49.3°, 85°≤ψ≤95°) to excite an SH wave (for example, see International Publication No. WO2005/099089A1). The SAW device sets the electrode thickness H/λ standardized with the SAW wavelength λ to 0.04<H/λ<0.12, thereby realizing reduction in size, a high Q value, and excellent frequency stability.

In such a SAW device, in order to solve a problem in that the Q value or frequency stability is deteriorated due to stress migration caused by a large electrode thickness, a technique is suggested in which grooves are formed in the quartz crystal substrate between the electrode fingers of the IDT (for example, see JP-A-2006-203408). When the depth of the grooves is Hp and the thickness of a metal film of the IDT is Hm, the electrode thickness H/λ standardized with the SAW wavelength λ is set to 0.04<H/λ<0.12 (where H=Hp+Hm), such that the apparent thickness of the metal film can be made small. Thus, it is possible to suppress a frequency fluctuation due to stress migration at the time of electrical conduction, thereby realizing a SAW device having a high Q value and excellent frequency stability.

During the mass production of SAW devices, when electrode fingers of an IDT are formed in the surface of a quartz crystal substrate by etching, if the thickness of the electrode fingers is large, a variation is likely to occur in the line occupancy (line space ratio) η of the IDT due to side etching. As a result, if a variation occurs in the frequency fluctuation with a change in the temperature of the SAW device, product reliability and quality are damaged. In order to solve this problem, a SAW device is known in which an in-plane rotation ST cut quartz crystal substrate having Euler angles (φ, θ, ψ)=(0°, 95°≤θ≤155°, 33°≤|ψ|≤46°) is used, a SAW stopband upper limit mode is excited, and inter-electrode-finger grooves are formed in the surface of the quartz crystal substrate between electrode fingers of an IDT (for example, see JP-A-2009-225420).

When the frequency-temperature characteristic of the SAW device is a quadratic curve in the operation temperature range, it is difficult to realize minimization of a frequency fluctuation range or an inflection point. Accordingly, a SAW device is suggested in which, in order to obtain a frequency-temperature characteristic of a cubic curve, an IDT electrode is formed on an LST cut quartz crystal substrate through a void layer and a dielectric film to excite a leaky SAW (for example, see Japanese Patent No. 3851336). Japanese Patent No. 3851336 describes that, in a SAW device using a Rayleigh wave, a quartz crystal substrate having a cut angle such that a frequency-temperature characteristic expressed by a cubit curve is realized could not be found.

In an ST cut quartz crystal SAW resonator or the like, in order to increase the Q value without deteriorating an excellent frequency-temperature characteristic, an inclined IDT is known in which an IDT and a reflector are arranged on the surface of a quartz crystal substrate to be inclined at a power flow angle PFA±3° with respect to a SAW phase velocity direction (for example, see Japanese Patent No. 3216137 and JP-A-2005-204275). In the SAW device having the inclined IDT, the IDT and the reflector are arranged so as to cover a SAW phase direction and a vibration energy direction, such that the SAW can be efficiently reflected by the reflector. Thus, it is possible to efficiently perform energy confinement and to further increase the Q value.

As described above, many elements are related to the frequency-temperature characteristic of the SAW device, and various studies are conducted for improvement. In particular, in a SAW using a Rayleigh wave, it is considered that an increase in the thickness of the electrode fingers constituting the IDT contributes to the improvement of the frequency-temperature characteristic. If the electrode thickness of the IDT simply increases, there is a problem in that deterioration in frequency stability or the like occurs due to stress migration at the time of electrical conduction or side etching at the time of IDT formation. As a countermeasure, grooves are formed between the electrode fingers of the IDT in the surface of the quartz crystal substrate, and it is effective to suppress a frequency fluctuation by increasing the effective thickness while making the electrode thickness small.

However, in all the SAW devices, excluding the SAW device described in JP-B-1-34411 which excites a leaky SAW, the frequency-temperature characteristic in the operation temperature range is expressed by a quadratic curve, it is not difficult to sufficiently reduce a frequency fluctuation range or to realize an inflection point. For this reason, it may be impossible to sufficiently cope with recent requirements for a SAW device, such as expansion or high-precision performance of an operation temperature range, long-term operation stability in an environment in which temperature undergoes severe changes, and the like.

The present invention is made by considering the above-described problems, and the object thereof is to provide a SAW device, such as a resonator or an oscillator, capable of exhibiting an excellent frequency-temperature characteristic with a very small frequency fluctuation in an operation temperature range, having an excellent environment-resistant characteristic ensuring a stable operation even in an environment in which a temperature varies extremely, and realizing a high Q value.

SUMMARY

With regard to a SAW resonator in which an in-plane rotation ST cut quartz crystal substrate is used, an IDT which excites a SAW in a stopband upper end mode is formed on the surface of the quartz crystal substrate, and the surface of the quartz crystal substrate between electrode fingers constituting the IDT is recessed to form grooves, the inventors have verified the relationship between parameters, such as the wavelength λ of the SAW, the depth G of the grooves, the electrode thickness H of the IDT, and the line occupancy η of the electrode fingers, and the frequency-temperature characteristic. As a result, the inventors have devised a novel SAW resonator which can realize minimization of a frequency fluctuation range and an inflection point in the operation temperature range.

A SAW resonator according to a new embodiment (hereinafter, referred to as a SAW resonator of this embodiment) includes an IDT which is provided on a quartz crystal substrate having Euler angles ($-1.5°≤\phi≤1.5°$, $117°≤\theta≤142°$, $42.79°≤|\psi|≤49.57°$), and excites a SAW in a stopband upper end mode. The quartz crystal substrate between electrode fingers constituting the IDT is depressed to form inter-electrode-finger grooves. When the wavelength of the SAW is λ, and the depth of the inter-electrode-finger groove is G, the relationship $0.01λ≤G$ is satisfied. When the line occupancy of the IDT is η, the depth G of the inter-electrode-finger grooves and the line occupancy η satisfy the following relationships.

[Equation 1]

$$-2.0000 \times G/λ + 0.7200 ≤ η ≤ -2.5000 \times G/λ + 0.7775 \text{ where } 0.0100λ ≤ G ≤ 0.0500λ \quad (1)$$

[Equation 2]

$$-3.5898 \times G/λ + 0.7995 ≤ η ≤ -2.5000 \times G/λ + 0.7775 \text{ where } 0.0500λ ≤ G ≤ 0.0695λ \quad (2)$$

In the SAW resonator of this embodiment, the depth G of the inter-electrode-finger grooves may satisfy the relationship $0.01λ≤G≤0.0695λ$. If the depth G of the inter-electrode-finger grooves is set within this range, it is possible to suppress a frequency fluctuation in an operation temperature range (for example, −40° C. to +85° C.) to be very small, and even when a manufacturing variation occurs in the depth of the inter-electrode-finger grooves, it is possible to suppress the shift amount of a resonance frequency between individual SAW resonators within a correctable range.

In the SAW resonator of this embodiment, when the electrode thickness of the IDT is H, the relationship $0<H≤0.035λ$ may be satisfied. Therefore, a satisfactory frequency-temperature characteristic in an operation temperature range is realized, and deterioration in an environment-resistant characteristic which may occur when the electrode thickness is large is prevented.

In the SAW resonator of this embodiment, the line occupancy η may satisfy the following relationship.

[Equation 3]

$$η = -1963.05 \times (G/λ)^3 + 196.28 \times (G/λ)^2 - 6.53 \times (G/λ) - 135.99 \times (H/λ)^2 + 5.817 \times (H/λ) + 0.732 - 99.99 \times (G/λ) \times (H/λ) \quad (3)$$

Therefore, it is possible to suppress a secondary temperature coefficient of the frequency-temperature characteristic to be small.

In the SAW resonator of this embodiment, the sum of the depth G of the inter-electrode-finger grooves and the electrode thickness H may satisfy the relationship $0.0407λ≤G+H$. Therefore, a high Q value is obtained compared to the related art which uses resonance in a stopband lower end mode with no grooves between electrode fingers.

FIGS. 1(A) to (D) show an example of a SAW resonator of this embodiment. As shown in FIG. 1(A), a SAW resonator 1 of this embodiment has a rectangular quartz crystal substrate 2, and an IDT 3 and a pair of reflectors 4 and 4 which are formed on the principal surface of the quartz crystal substrate.

For the quartz crystal substrate 2, an in-plane rotation ST cut quartz crystal substrate which is expressed by Euler angles ($-1.5°≤\phi≤1.5°$, $117°≤\theta≤142°$, $42.79°≤|\psi|≤49.57°$) is used. Here, the Euler angles will be described. A substrate which is expressed by Euler angles (0°, 0°, 0°) becomes a Z cut substrate which has a principal surface perpendicular to the Z axis. Of the Euler angles ($\phi$, $\theta$, $\psi$), $\phi$ relates to the first rotation of the Z cut substrate, and is a first rotation angle with the Z axis as a rotation axis. The rotation direction from the +X axis to the +Y axis is defined as a positive rotation angle. Of the Euler angles, θ relates to the second rotation after the first rotation of the Z cut substrate, and is a second rotation angle with the X axis after the first rotation as a rotation axis. The rotation direction from the +Y axis after the first rotation to the +Z axis is defined as a positive rotation angle. The cut plane of the piezoelectric substrate is determined by the first rotation angle $\phi$ and the second rotation angle θ. Of the Euler angles, $\psi$ relates to the third rotation after the second rotation of the Z cut substrate, and is a third rotation angle with the Z axis after the second rotation as a rotation axis. The rotation direction from the +X axis after the second rotation to the +Y axis after the second rotation is defined as a positive rotation angle. The SAW propagation direction is expressed by the third rotation angle $\psi$ with respect to the X axis after the second rotation.

As shown in FIG. 2, when three crystal axes perpendicular to quartz crystal, that is, an electrical axis, a mechanical axis, and an optical axis are respectively expressed by the X axis, the Y axis, and the Z axis, the in-plane rotation ST cut quartz crystal substrate is cut from a wafer 5 which has an XZ' plane perpendicular to the Y' axis of the coordinate axes (X, Y', Z') obtained by rotating an XZ plane 5a perpendicular to the Y axis at an angle θ' (°) from the +Z axis to the −Y axis with the X axis as a rotation axis. The quartz crystal substrate 2 is cut and individualized from the wafer 5 along new coordinate axes (X', Y', Z") at an angle +$\psi$ (or −$\psi$) (°) from the +X axis to the +Z' axis with the Y' axis as a rotation axis. The direction from the +X axis to the +Z' axis is defined as positive. At this time, the long side (or short side) of the quartz crystal substrate 2 may be arranged along either the X'-axis direction or the Z"-axis direction. The angle θ' and θ of the Euler angles satisfy the relationship θ'=θ−90°.

An IDT 3 has a pair of interdigital transducers 3a and 3b which respectively have a plurality of electrode fingers 6a and 6b, and bus bars 7a and 7b connecting the base portions of the electrode fingers together. The electrode fingers 6a and 6b are arranged such that the extension direction thereof is perpendicular to the propagation direction X' of the SAW which is excited by the IDT. The electrode fingers 6a of the interdigital transducer 3a and the electrode fingers 6b of the interdigital transducer 3b are arranged with a given pitch alternately and at a predetermined interval. As shown in FIG. 1(B), inter-electrode-finger grooves 8 having a given depth are recessed in the surface of the quartz crystal substrate 2 which is exposed between the electrode fingers 6a and 6b by removing the surface through etching or the like.

A pair of reflectors 4 and 4 are arranged outside the IDT 3 with the IDT sandwiched therebetween along the SAW propagation direction X'. The reflectors 4 respectively have a plurality of conductor strips 4a and 4a arranged with a given pitch in the SAW propagation direction X'. Similarly to the electrode fingers of the IDT 3, the conductor strips are arranged such that the extension direction thereof is perpendicular to the SAW propagation direction X'. As shown in FIG. 1(B), inter-conductor-strip grooves 9 having a given depth are recessed in the surface of the quartz crystal substrate 2 which is exposed between the conductor strips 4a and 4a by removing the surface through etching or the like.

In this embodiment, the electrode fingers 6a and 6b and the conductor strips 4a and 4a are formed of a metal film using, for example, Al or an alloy mainly containing Al to have the same thickness H, and may be collectively referred to as electrode fingers. The inter-electrode-finger grooves 8 and the inter-conductor-strip grooves 9 are formed to have the same depth G. Grooves are recessed between the outermost electrode fingers 6a (or 6b) of the IDT 3 and the conductor strips 4a and 4a of the reflectors 4 and 4 adjacent to the electrode fingers by removing the surface of the quartz crystal substrate to have the same depth as the inter-conductor-strip grooves.

The SAW resonator 1 configured as above excites a Rayleigh-type SAW which has vibration displacement components in both the X'-axis direction and the Y'-axis direction of the quartz crystal substrate 2. In the quartz crystal substrate 2 having the above-described Euler angles, the SAW propagation direction is shifted from the X axis serving as the crystal axis of quartz crystal, making it possible to excite the SAW in the stopband upper end mode.

The Euler angles ($\phi$, $\theta$, $\psi$) of the quartz crystal substrate 2 were selected as follow. In general, the frequency-temperature characteristic of the SAW resonator is expressed by the following expression.

$$\Delta f = \alpha \times (T-T0) + \beta \times (T-T0)^2$$

Here, $\Delta f$ is a frequency change amount (ppm) between a temperature T and a peak temperature T0, $\alpha$ is a primary temperature coefficient (ppm/°C.), $\beta$ is a secondary temperature coefficient (ppm/°C.$^2$), T is a temperature, and T0 is a temperature (peak temperature) at which a frequency is maximum. The absolute value of the secondary temperature coefficient $\beta$ is set to be minimum, preferably, equal to or smaller than 0.01 (ppm/°C.$^2$), and more preferably, substantially zero, such that a frequency-temperature characteristic shows a cubic curve, a frequency fluctuation becomes small even in a wide operation temperature range, thereby obtaining high frequency stability.

First, the Euler angles of the quartz crystal substrate 2 were set to (0°, 123°, $\psi$), and the relationship between the Euler angle $\psi$ and the depth G of the inter-electrode-finger grooves when the line occupancy $\eta$ resulting in $\beta=\pm 0.01$ (ppm/°C.$^2$) has been obtained was simulated. The Euler angle $\psi$ was appropriately selected such that the absolute value of the secondary temperature coefficient $\beta$ became 0.01 (ppm/°C.$^2$). As a result, the range of the Euler angle $\psi$ for obtaining the secondary temperature coefficient $\beta$ of $-0.01 \le \beta \le +0.01$ under the above-described condition could be determined to 43°<$\psi$<45°.

As shown in FIG. 1(C), the line occupancy $\eta$ of the IDT 3 is a value obtained by dividing an electrode finger width L by an electrode finger pitch $\lambda/2$ (=L+S). FIG. 1(D) illustrates a method of specifying the line occupancy $\eta$ of the IDT 3 in a trapezoidal cross-section which will be formed when the electrode fingers 6a and 6b of the IDT 3 and the inter-electrode-finger grooves 8 are manufactured by a photolithography technique and an etching technique. In this case, the line occupancy $\eta$ is calculated on the basis of the electrode finger width L and an inter-electrode-finger groove width S measured at a height half the sum (G+H) of the depth G of the inter-electrode-finger grooves from the bottom of the inter-electrode-finger grooves 8 and the electrode thickness H.

Next, when the cut angle and the quartz crystal substrate 2 and the SAW propagation direction were (0, $\theta$, $\psi$) in the Euler angle expression, the depth G of the inter-electrode-finger grooves was 0.04$\lambda$, the thickness H of the electrode fingers was 0.02$\lambda$, and the line occupancy $\eta$ was 0.6383 by Expression (3), changes in the secondary temperature coefficient $\beta$ depending on the Euler angle $\theta$ were simulated. The Euler angle $\psi$ was appropriately selected in the above-described range 43°<$\psi$<45° such that the absolute value of the secondary temperature coefficient $\beta$ was minimum on the basis of the set angle of the angle $\theta$. As a result, if the Euler angle $\theta$ was within the range of 117°$\le\theta\le$142°, it was confirmed that, even when the thickness H of the electrode fingers, the depth G of the inter-electrode-finger grooves, and the line occupancy $\eta$ were changed, the absolute value of the secondary temperature coefficient $\beta$ was within the range of 0.01 (ppm/°C.$^2$).

Next, the quartz crystal substrate 2 was) ($\phi$, 123°, 43.77°) in the Euler angle expression, the depth G of the inter-electrode-finger grooves was 0.04$\lambda$, the thickness H of the electrode fingers was 0.02$\lambda$, and the line occupancy $\eta$ was 0.65, changes of the secondary temperature coefficient $\beta$ depending on the Euler angle $\phi$ were simulated. As a result, if the Euler angle $\phi$ was within the range of $-1.5° \le \phi \le +1.5°$, it was confirmed that the absolute value of the secondary temperature coefficient $\beta$ was within the range of 0.01 (ppm/°C.$^2$).

A highly desirable relationship between the Euler angles $\theta$ and $\psi$ such that a frequency fluctuation was minimum in an operation temperature range ($-40°$ C. to $+85°$ C.) was obtained by a simulation. In this case, the depth G of the inter-electrode-finger grooves and the thickness H of the electrode fingers were respectively G=0.04$\lambda$ and H=0.02$\lambda$. As a result, the Euler angle $\psi$ increased within the above-described range of the Euler angle $\theta$ such that a cubic curve was drawn with an increase in the Euler angle $\psi$. This relationship can be approximated by the following expression.

[Equation 4]

$$\psi = 1.19024 \times 10^{-3} \times \theta^3 - 4.48775 \times 10^{-1} \theta^2 + 5.64362 \times 10^1 \times \theta - 2.32327 \times 10^3 \pm 1.0$$

Thus, the Euler angle $\psi$ becomes $\psi=42.79°$ with respect to the lower limit value $\theta=117°$ of the Euler angle $\theta$, and $\psi=49.57°$ with respect to the upper limit value $\theta=142°$ of the Euler angle $\theta$. Therefore, the Euler angle $\psi$ can be set to 42.79°$\le\psi\le$49.57° within the range of 117°$\le\theta\le$142°.

If the Euler angles of the quartz crystal substrate 2 are set in the above-described manner, the SAW resonator 1 of this embodiment can realize an excellent frequency-temperature characteristic in which the absolute value of the secondary temperature coefficient $\beta$ is equal to or smaller than 0.01 (ppm/°C.$^2$).

With regard to the SAW resonator 1 of this embodiment, a frequency-temperature characteristic was simulated under the following conditions.

Basic data of SAW resonator 1 of this embodiment
H: 0.02λ,
G: change
IDT line occupancy η: 0.6
Reflector line occupancy ηr: 0.8
Euler angles: (0°, 123°, 43.5°)
Number of pairs of IDT: 120
Electrode finger cross width: 40λ.(λ=10 μm)
Number of reflectors (per side): 60
Inclination angle of electrode fingers: none The simulation result is shown in FIG. 3. As will be understood from FIG. 3, the frequency-temperature characteristic substantially shows a cubic curve in the operation temperature range (−40 to +85° C.), and the frequency fluctuation range can be suppressed with a very small fluctuation within 20 ppm.

With regard to the SAW resonator 1 showing the frequency-temperature characteristic of FIG. 3, if the frequency, the equivalent circuit constant, and the static characteristic are put together, Table 1 is obtained.

TABLE 1

|  | F (MHz) | Q | γ | CI (Ω) | M |
|---|---|---|---|---|---|
| AVG | 318.25 | 13285 | 2476 | 21.8 | 5.4 |

Here, F is a frequency, Q is a Q value, γ is a capacitance ratio, CI is a CI (Crystal Impedance) value, and M is a figure of merit.

The SAW resonator 1 is preferably set such that the frequency ft2 of the stopband upper end of the IDT 3, the frequency fr1 of the stopband lower end of the reflector 4, and the frequency fr2 of the stopband upper end of the reflector 4 satisfy the relationship fr1<ft2<fr2. FIG. 4 shows the SAW reflection characteristics of the IDT 3 and the reflector 4 depending on the frequency. As shown in FIG. 4, if the frequency ft2 is set between the frequency fr1 and the frequency fr2, the reflection coefficient of the reflector 4 becomes larger than the reflection coefficient of the IDT 3 at the frequency ft2. As a result, the SAW in the stopband upper end mode excited from the IDT 3 is reflected from the reflector 4 to the IDT with a higher reflection coefficient. Therefore, the vibration energy of the SAW can be efficiently confined, thereby realizing a low-loss SAW resonator 1.

The relationship between the Q value of the SAW resonator 1 and the magnitude (G+H) of a step formed by the height, that is, thickness H of the electrode fingers 6a and 6b and the depth G of the inter-electrode-finger grooves 8 was verified by a simulation. For comparison, with regard to a SAW resonator of the related art in which no grooves are formed between the electrode fingers and resonance in the stopband upper end mode is used, the relationship between the Q value and the height, that is, thickness of the electrode fingers was simulated under the following conditions.

Basic data of SAW resonator of the related art
H: change
G: zero (none)
IDT line occupancy η: 0.4
Reflector line occupancy ηr: 0.3
Euler angles (0°, 123°, 43.5°)
Number of pairs of IDT: 120
Electrode finger cross width: 40λ.(λ=10 μm)
Number of reflectors (per side): 60
Inclination angle of electrode fingers: none The simulation result is shown in FIG. 5. In FIG. 5, a bold line indicates the SAW resonator 1 of this embodiment, and a thin line indicates the SAW resonator of the related art. As will be understood from FIG. 5, in the SAW resonator 1 of this embodiment, a high Q value can be obtained in a region where the step (G+H) is equal to or greater than 0.0407λ (4.070% λ), compared to the SAW resonator of the related art.

On the other hand, in the SAW resonator of this embodiment, it was ascertained that a variation in the frequency-temperature characteristic occurred between individuals. As described above, in this embodiment, an excellent frequency-temperature characteristic of a cubic curve is realized with the SAW wavelength λ, the depth G of the inter-electrode-finger grooves, and the IDT line occupancy η, and the electrode finger thickness H as parameters. Thus, the inventors have considered that manufacturing errors in the parameters have no influence on a variation in the frequency-temperature characteristic, and have verified the relationship.

At the time of the mass production of SAW devices, in general, the electrode fingers of the IDT are formed by photoetching an electrode film, but it is postulated that the line width L has normally a manufacturing error of about 0.5%. In this case, it is considered that the IDT line occupancy η has a manufacturing variation at the same level. On the basis of the postulation, in the SAW resonator 1 of FIG. 1, when the electrode finger thickness is H=2% λ, the groove depth is G=3.5% λ, the IDT line occupancy is η=0.63 (=63%), and when the parameters are shifted by ±0.005 (=±0.5%), the frequency-temperature characteristics were calculated by simulations. FIG. 6 shows the results.

In both cases, the frequency-temperature characteristic is expressed by a cubic curve having a maximum value, a minimum value, and an inflection point between the maximum value and the minimum value in a use temperature range. When η=0.63 (solid line), an exceptional frequency-temperature characteristic was shown in which the frequency fluctuation in the use temperature range (−40° C. to +85° C.) was within ±5 ppm, and the position of the inflection point, that is, the inflection-point temperature was substantially the center of the use temperature range and substantially rotationally symmetric. Meanwhile, when η=0.625 (fine broken line) and 0.635 (large broken line), it is understood that the frequency-temperature characteristic is deteriorated in which a frequency fluctuation increases to be equal to or greater than ±5 ppm in the use temperature range, and the inflection-point temperature is significantly shifted to the low-temperature side or the high-temperature side and rotationally asymmetric.

Next, the inventors have verified an influence of a change in an inflection-point temperature on a frequency fluctuation in a frequency-temperature characteristic. FIG. 7 shows the relationship between a change amount in the inflection-point temperature and a deviation in the frequency fluctuation when η=0.63 of FIG. 6. From FIG. 7, it is understood that, if the inflection-point temperature changes, a deviation in the frequency fluctuation increases, affecting the frequency-temperature characteristic.

The inventors have verified an influence of a change in the depth G of the inter-electrode-finger grooves relating to the electrode finger thickness H on a change amount in the inflection-point temperature due to a variation (±0.005) in the IDT line occupancy η, that is, the frequency-temperature characteristic. In this specification, it is assumed that a change amount in the inflection-point temperature due to a variation in the IDT line occupancy η is called inflection-point sensitivity as an index representing the influence on the frequency-temperature characteristic.

First, in the SAW resonator 1 of FIG. 1, when the Euler angles of the quartz crystal substrate 2 are set to (0°, 123°, ψ), the electrode finger thickness H is fixed to 1% λ, and the inter-electrode-finger groove depth G changes by 1% λ in a range of 2% λ to 7% λ, the relationship between the IDT line occupancy η such that the secondary temperature coefficient β of the frequency-temperature characteristic is equal to or smaller than 0.01 and the inflection-point sensitivity due to a variation of ±0.005 in the η value was calculated by a simulation. The result is shown in FIG. 8. As will be understood from FIG. 8, in both cases, as η increases, the inflection-point sensitivity decreases, such that the influence on the frequency-temperature characteristic is reduced.

Next, when the electrode finger thickness H is fixed to 1.5% λ, and the groove depth G changes by 1% λ in a range of 2% λ to 7% λ, the relationship between the IDT line occupancy η such that the secondary temperature coefficient β of the frequency-temperature characteristic is equal to or smaller than 0.01 and the inflection-point sensitivity due to a variation of ±0.005 in the η value was calculated by a simulation under the same conditions as in FIG. 8. The result is shown in FIG. 9. From FIG. 9, it is understood that, in both cases, as η increases, the inflection-point sensitivity decreases, such that the influence on the frequency-temperature characteristic is reduced.

FIG. 10 is a plot diagram of a change in the inflection-point temperature relating to the IDT line occupancy η in the simulation result of FIG. 8. FIG. 10 shows that, as η increases, the change rate of the inflection-point temperature increases.

In general, in an AT cut quartz crystal vibrator of a thickness-shear vibration mode, it is known that the inflection point of the frequency-temperature characteristic is preferably determined only by the cut angle of the quartz crystal substrate and does not change depending on other parameters. Meanwhile, in a SAW device, it is not obvious how much the parameters other than the cut angle of the quartz crystal substrate affect the frequency-temperature characteristic and the inflection-point temperature.

Accordingly, the inventors have verified the influence of the relationship between the IDT line occupancy η, the electrode thickness H of the IDT 3 and the inter-electrode-finger groove depth G, and the relationship therebetween on the frequency-temperature characteristic and the inflection-point sensitivity in the SAW resonator 1 of this embodiment. As a result, the inventors have found that the inflection-point temperature of the frequency-temperature characteristic may be optimally adjustable in the operation temperature range depending on the IDT line occupancy while maintaining a satisfactory frequency-temperature characteristic. The inventors have devised the invention on the basis of the findings.

A SAW device according to an aspect of the invention includes a quartz crystal substrate having Euler angles $(-1.5°\leq\phi\leq1.5°, 117°\leq\theta\leq142°, |\psi|\neq90°\times n$ (where n=0, 1, 2, 3)), and an IDT which has a plurality of electrode fingers in the principal surface of the quartz crystal substrate and excites a Rayleigh wave in a stopband upper end mode.

A frequency-temperature characteristic is expressed by a curve having a maximum value, a minimum value, and an inflection point between the maximum value and the minimum value, and the temperature of the inflection point is adjustable depending on an IDT line occupancy so as to be within a desired operation temperature range.

With this configuration, the frequency-temperature characteristic controls the inflection point to a desired temperature or a desired temperature region within the operation temperature range depending on the IDT line occupancy η, thereby improving a frequency fluctuation to be smaller. Therefore, it is possible to constantly obtain an optimum frequency-temperature characteristic in the required operation temperature range of the SAW device.

A SAW device according to another aspect of the invention includes a quartz crystal substrate having Euler angles $(-1.5°\leq\phi\leq1.5°, 117°\leq\theta\leq142°, |\psi|\neq90°\times n$ (where n=0, 1, 2, 3)), and an IDT which has a plurality of electrode fingers in the principal surface of the quartz crystal substrate and excites a Rayleigh wave in a stopband upper end mode.

Inter-electrode-finger grooves are recessed in the surface of the piezoelectric substrate between adjacent electrode fingers of the IDT.

The wavelength λ of the Rayleigh wave and the depth G of the inter-electrode-finger grooves satisfy the relationship $0.01\lambda \leq G \leq 0.07\lambda$. The line occupancy η of the IDT and the depth G of the inter-electrode-finger grooves satisfy the following relationships.

[Equation 5]

$$-2.0000 \times G/\lambda + 0.7200 \leq \eta \leq -2.5000 \times G/\lambda + 0.7775 \text{ where } 0.0100\lambda \leq G \leq 0.0500\lambda$$

[Equation 6]

$$-3.5898 \times G/\lambda + 0.7995 \leq \eta \leq -2.5000 \times G/\lambda + 0.7775 \text{ where } 0.0500\lambda \leq G \leq 0.0695\lambda$$

A frequency-temperature characteristic is expressed by a curve having a maximum value, a minimum value, and an inflection point between the maximum value and the minimum value, and the temperature of the inflection point is adjustable depending on the IDT line occupancy so as to be within a range of ±30° C. from the center temperature Tc of a desired operation temperature range.

In a satisfactory frequency-temperature characteristic which is obtained by defining the relationship between the inter-electrode-finger groove depth G, the electrode finger thickness H, and the IDT line occupancy η in the above-described manner, the inflection point temperature changes depending on the IDT line occupancy η and is adjusted so as to fall within a range of the center temperature Tc±30° C. of a desired operation temperature range, thereby suppressing a frequency fluctuation to be small. While the frequency-temperature characteristic of the SAW device is basically determined by the cut angle of the quartz crystal substrate to be used, the frequency-temperature characteristic can be optimally improved by changing the inflection-point temperature.

In the SAW device having the inter-electrode-finger grooves, the IDT line occupancy η may satisfy the following relationship.

$$a(Tc-30)^6 + b(Tc-30)^5 + c(Tc-30)^4 + d(Tc-30)^3 + e(Tc-30)^2 + f(Tc-30) + 0.606 \leq \eta \leq a(Tc+30)^6 + b(Tc+30)^5 + c(Tc+30)^4 + d(Tc+30)^3 + e(Tc+30)^2 + f(Tc+30) + 0.606$$

(where $a=-2.60\times10^{-12}, b=4.84\times10^{-10}, c=-2.13\times10^{-8}, d=1.98\times10^{-2}, e=1.42\times10^{-5}, f=1.48\times10^{-4}$)

Therefore, it is possible to control the frequency-temperature characteristic such that the inflection-point temperature reliably falls within a range of the center temperature Tc±30° C. of the operation temperature range.

The Euler angle ψ of the quartz crystal substrate may be within a range of 42.79°≤|ψ|≤49.57°. Therefore, an excellent frequency-temperature characteristic having a very small frequency fluctuation in a wide operation temperature range is obtained.

The IDT line occupancy η may satisfy the following relationship.

$$\eta = -1963.05 \times (G/\lambda)^3 + 196.28 \times (G/\lambda)^2 - 6.53 \times (G/\lambda) - 135.99 \times (H/\lambda)^2 + 5.817 \times (H/\lambda) + 0.732 - 99.99 \times (G/\lambda) \times (H/\lambda)$$ [Equation 7]

Therefore, it is possible to suppress the secondary temperature coefficient of the frequency-temperature characteristic to be smaller, thereby obtaining a more excellent frequency-temperature characteristic of a cubic curve having a smaller frequency fluctuation.

The sum of the depth G of the inter-electrode-finger grooves and the thickness H of the electrode fingers may satisfy 0.0407λ≤G+H. Therefore, in the aspect of the invention which uses resonance in the stopband upper end mode, a high Q value is obtained compared to a SAW resonator of the related art which uses resonance in the stopband lower end mode with no grooves between the electrode fingers of the IDT.

The SAW device may further include a pair of reflectors which respectively have a plurality of conductor strips on the principal surface of the quartz crystal substrate and are arranged on both sides of the IDT with the IDT sandwiched therebetween along a SAW propagation direction. Inter-conductor-strip grooves are recessed in the surface of the quartz crystal substrate between adjacent conductor strips of the reflectors. An angle between a first direction perpendicular to the electrode fingers and the conductor strips and the electrical axis of the quartz crystal substrate may be the Euler angle ψ of the quartz crystal substrate. At least a part of the IDT and the reflectors may be arranged in a second direction intersecting the first direction at an angle δ. The angle δ is set to be within a range of a power flow angle ±1° of the quartz crystal substrate. Therefore, it is possible to further improve the Q value.

The SAW device may further include an oscillation circuit which drives the IDT. Therefore, it is possible to obtain a SAW oscillator having a very small frequency fluctuation in a wide operation temperature range, a low CI value, and excellent oscillation stability.

According to still another aspect of the invention, an electronic apparatus and a sensor apparatus include the above-described SAW device. Therefore, an electronic apparatus and a sensor apparatus which stably exhibit satisfactory performance in a wide operation temperature range with high reliability are provided.

DETAILED DESCRIPTION

Figure 1A:
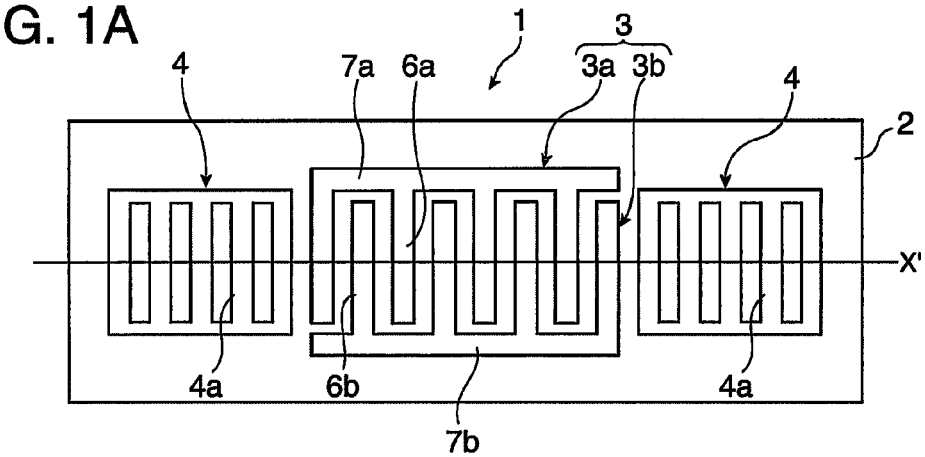
FIG. 1(A) is a plan view showing the configuration of a SAW resonator of this embodiment.
Figure 1B:
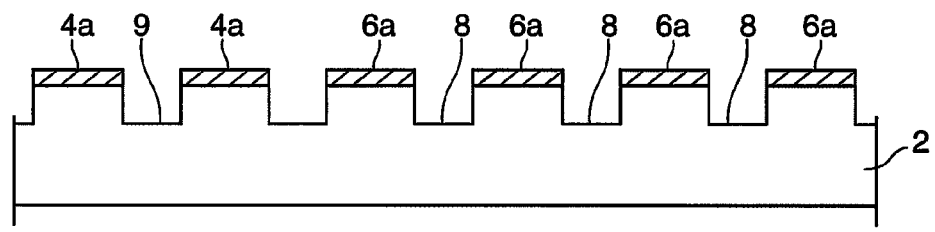
FIG. 1(B) is a partial enlarged longitudinal sectional view.
Figure 1C:
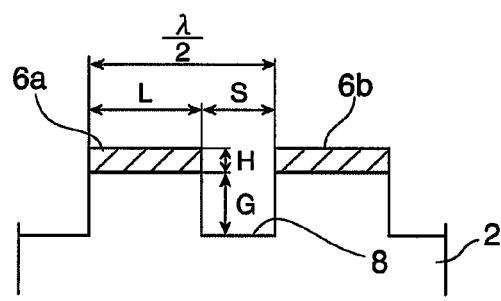
FIG. 1(C) is a partial enlarged view.
Figure 1D:
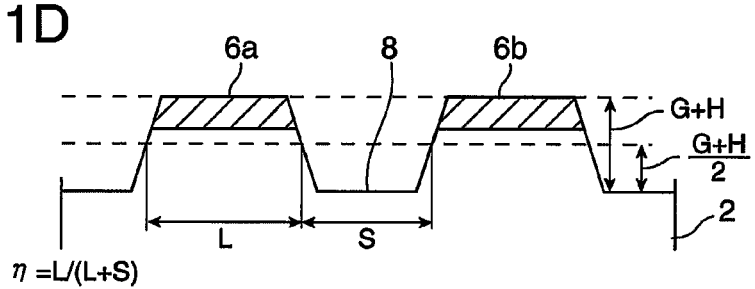
FIG. 1(D) is a partial enlarged sectional view showing the shape of inter-electrode-finger grooves which are formed by photolithography and etching techniques, and corresponding to FIG. 1(C).
Figure 2:
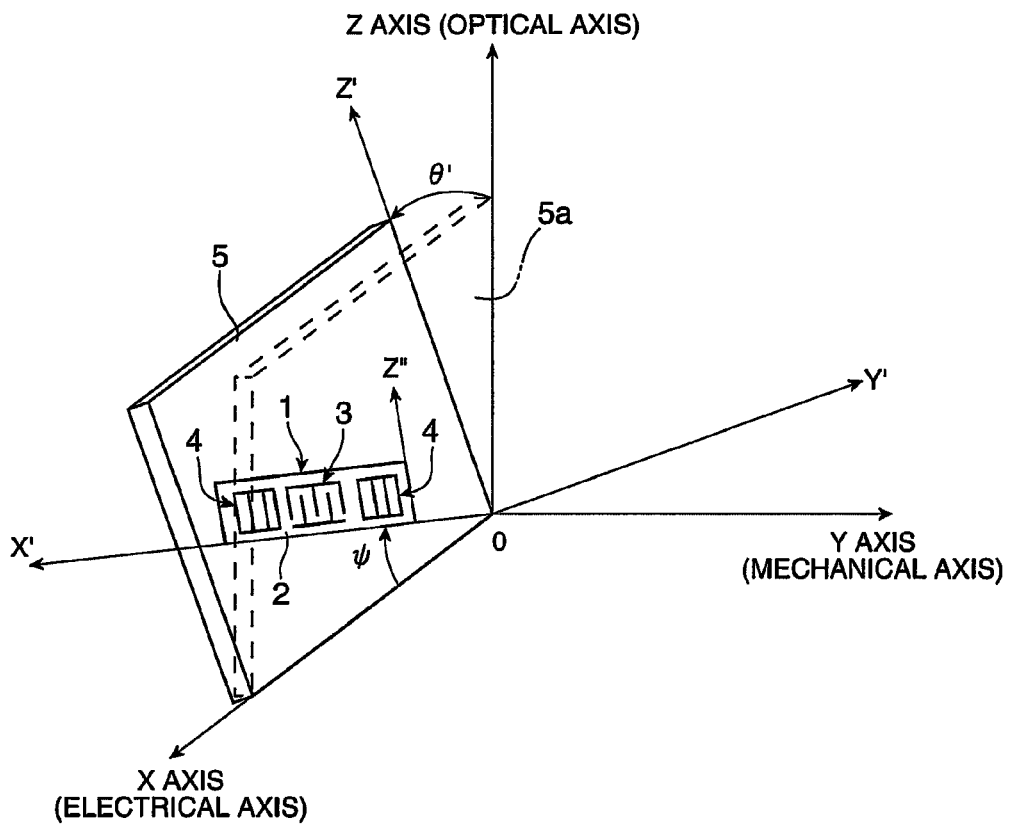
FIG. 2 is an explanatory view schematically showing a quartz crystal substrate of this embodiment.
Figure 3:
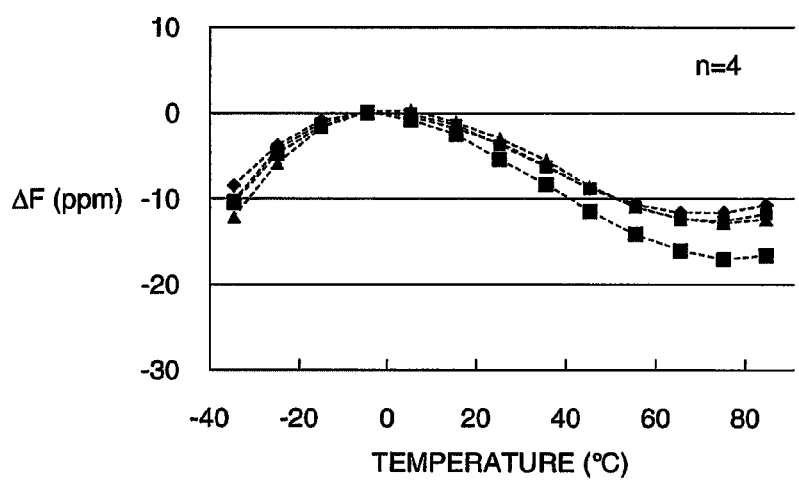
FIG. 3 is a diagram showing a frequency-temperature characteristic of this embodiment.
Figure 4:
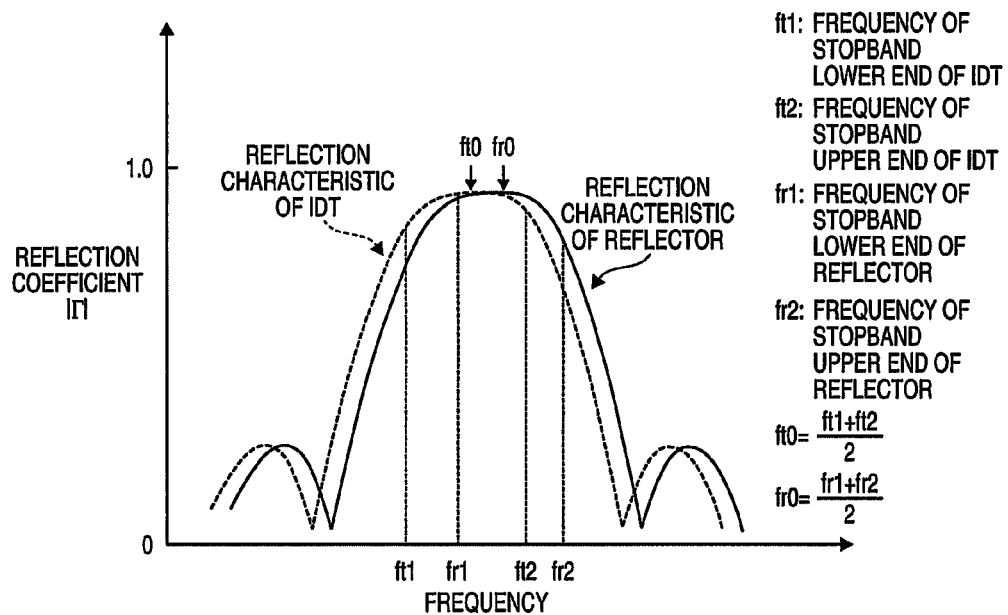
FIG. 4 is a diagram showing SAW reflection characteristics of an IDT and a reflector.
Figure 5:
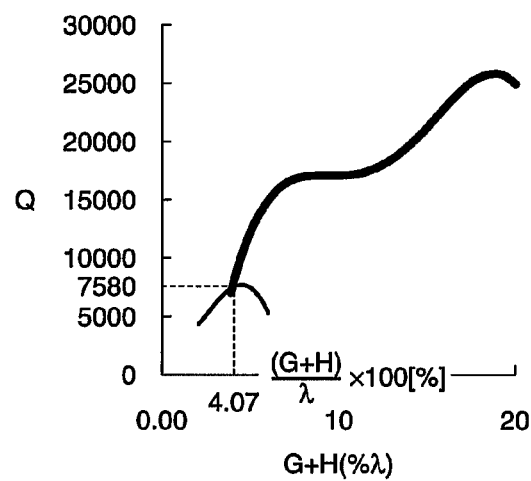
FIG. 5 is a diagram showing the relationship between a step between electrode fingers of this embodiment and a Q value.
Figure 6:
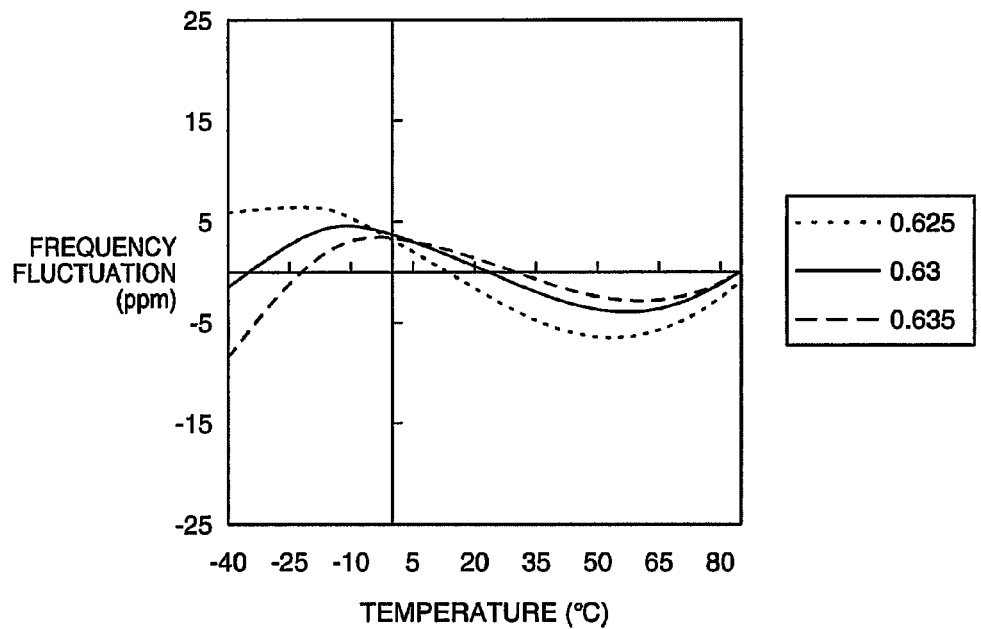
FIG. 6 is a diagram showing a variation in a frequency-temperature characteristic due to a variation in an IDT line occupancy η of this embodiment.
Figure 7:
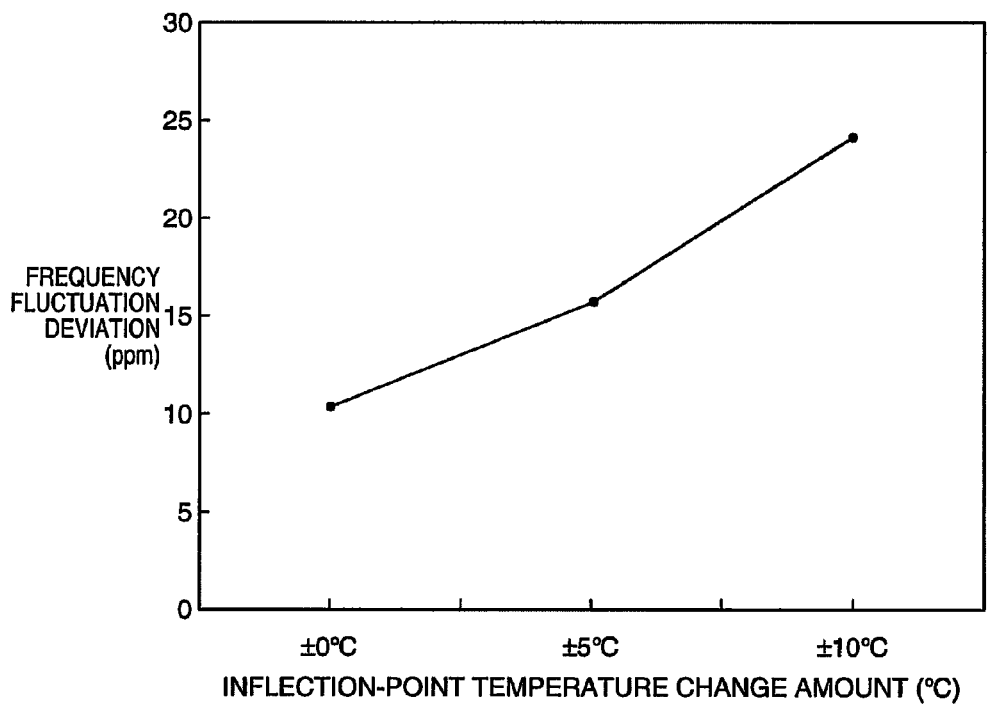
FIG. 7 is a diagram showing the relationship between a change amount in an inflection-point temperature and a deviation in a frequency fluctuation in a frequency-temperature characteristic of this embodiment.
Figure 8:
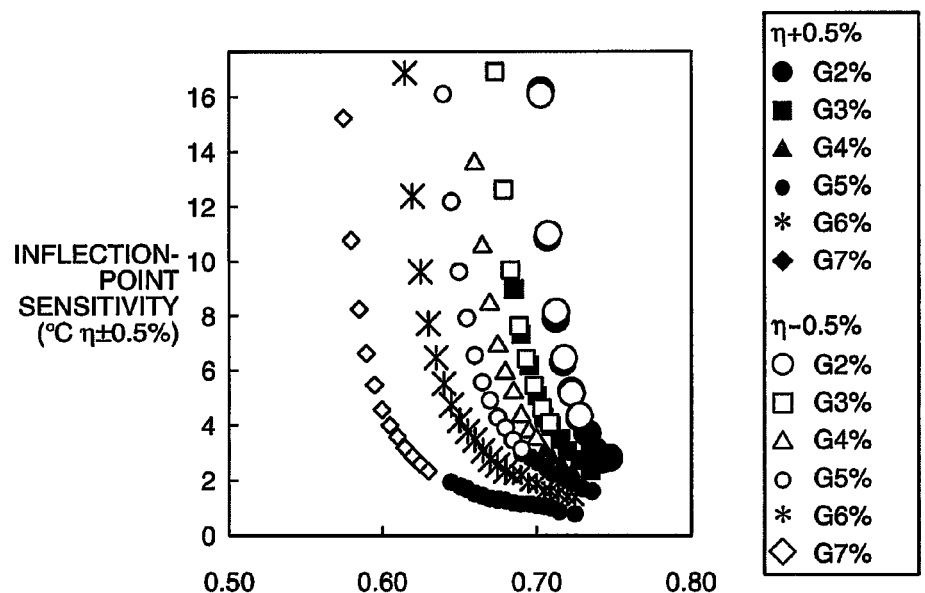
FIG. 8 is a diagram showing the relationship between an IDT line occupancy η and an inflection-point sensitivity such that a secondary temperature coefficient is β≤0.01 when an electrode finger thickness is H=1% λ and an inter-electrode-finger groove depth is G=2% λ to 7% λ in this embodiment.
Figure 9:
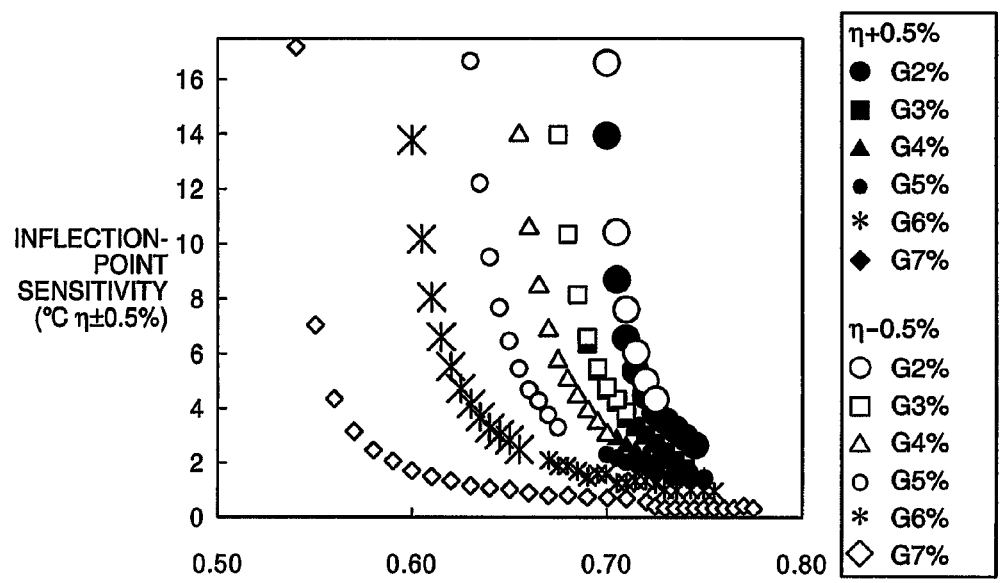
FIG. 9 is a diagram showing the relationship between an IDT line occupancy η and an inflection-point sensitivity such that a secondary temperature coefficient is β≤0.01 when an electrode finger thickness is H=1.5% λ and an inter-electrode-finger groove depth is G=2% λ to 7% λ in this embodiment.
Figure 10:
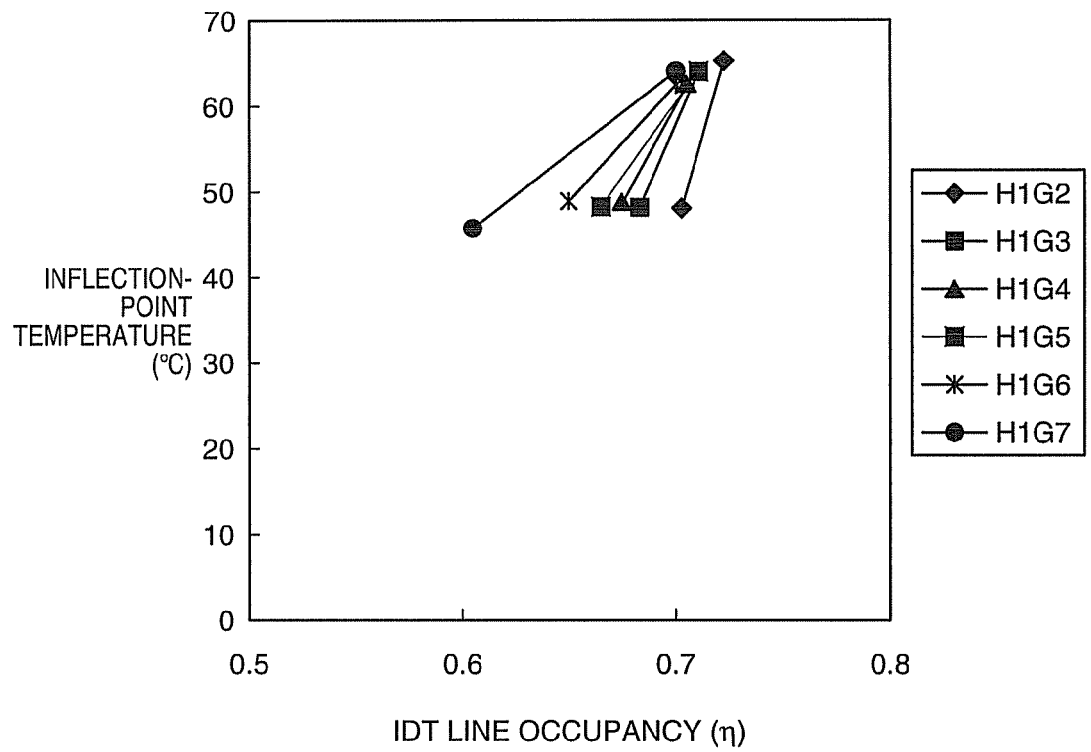
FIG. 10 is a diagram showing the relationship between an IDT line occupancy η and an inflection-point temperature in the case of FIG. 8.

Hereinafter, preferred examples of the invention will be described in detail with reference to the accompanying drawings. In the accompanying drawings, the same or similar constituent elements are represented by the same or similar reference numerals.

A SAW resonator which is a first example of a SAW device according to the invention has the same basic configuration as the SAW resonator 1 shown in FIG. 1, and description thereof will be provided with reference to FIG. 1. That is, the SAW resonator 1 of this example has a rectangular quartz crystal substrate 2, and an IDT 3 and a pair of reflectors 4 and 4 which are formed on the principal surface of the quartz crystal substrate. The quartz crystal substrate 2 uses a quartz crystal substrate having Euler angles (−1.5°≤ϕ≤1.5°, 117°≤θ≤142°, ψ). The Euler angle ψ is set such that |ψ|90°×n (where n=0, 1, 2, 3) is satisfied.

The IDT 3 has a pair of interdigital transducers 3a and 3b which respectively have a plurality of electrode fingers 6a and 6b, and bus bars 7a and 7b connecting the base portions of the electrode fingers 6a and 6b. The electrode fingers 6a and 6b are arranged such that the extension direction thereof is perpendicular to the propagation direction of a SAW which is excited by the IDT. The electrode fingers 6a of the interdigital transducer 3a and the electrode fingers 6b of the interdigital transducer 3b are arranged with a given pitch alternately and at a predetermined interval. Inter-electrode-finger grooves 8 having a given depth are recessed in the surface of the quartz crystal substrate 2 exposed between the electrode fingers 6a and 6b by removing the surface through etching or the like.

A pair of reflectors 4 and 4 are arranged outside the IDT 3 with the IDT sandwiched therebetween along the SAW propagation direction. The reflectors 4 respectively have a plurality of conductor strips (electrode fingers) 4a and 4a arranged with a given pitch in the SAW propagation direction. The conductor strips are arranged such that the extension direction thereof is perpendicular to the SAW propagation direction. Inter-conductor-strip grooves 9 are recessed in the surface of the quartz crystal substrate 2 exposed between the conductor strips 4a and 4a by removing the surface through etching or the like.

The electrode fingers and the conductor strips are formed of a metal film using, for example, Al or an alloy mainly containing Al to have the same thickness H. The inter-electrode-finger grooves and the inter-conductor-strip grooves are formed to have the same depth G. Similarly, grooves having the same depth as the inter-electrode-finger grooves are formed between the innermost conductor strips of the reflectors 4 and 4 and the outermost electrode fingers 6a (or 6b) of the IDT 3 at a predetermined interval by removing the surface of the quartz crystal substrate.

With this configuration, the SAW resonator 1 excites a Rayleigh-type SAW which has vibration displacement components in both the X'-axis direction and the Y'-axis direction of the quartz crystal substrate 2. With the use of the quartz crystal substrate 2 having the above-described Euler angles, the SAW propagation direction is shifted from the X axis which is the crystal axis of quartz crystal, thereby exciting the SAW in the stopband upper end mode.

The SAW resonator 1 has a frequency-temperature characteristic which is expressed by a curve (for example, a cubic curve) having a maximum value, a minimum value, and an inflection point between the maximum value and the minimum value in an operation temperature range. In this example, it is assumed that the center temperature Tc of the operation temperature range is a target temperature, and a given allowable temperature region from the center temperature Tc, for example, a range of ±30° C. is a target temperature range. For example, when the operation temperature range is −40° C. to +85° C., the center temperature is Tc=(−40+85)/2=22.5° C. Thus, the target temperature range is defined by an upper limit temperature TH=22.5° C.+30° C.=52.5° C. and a lower limit temperature TL=22.5° C.−30° C.=−7.5° C.

In this example, the line occupancy η of the IDT 3 is set such that the temperature of the inflection point of the frequency-temperature characteristic falls within at least the target temperature range. In the SAW resonator 1, when the Euler angles of the quartz crystal substrate 2 are set to (0°, 123°, ψ), the thickness H of the electrode fingers of the IDT 3 is 0.02λ (2% λ), and the depth G of the inter-electrode-finger grooves is 0.05λ (5% λ), the relationship between the IDT line occupancy η and the inflection-point temperature of the frequency-temperature characteristic was calculated by a simulation in a range of η=0.6 to 0.8. The result is shown in FIG. 11.

Figure 11:
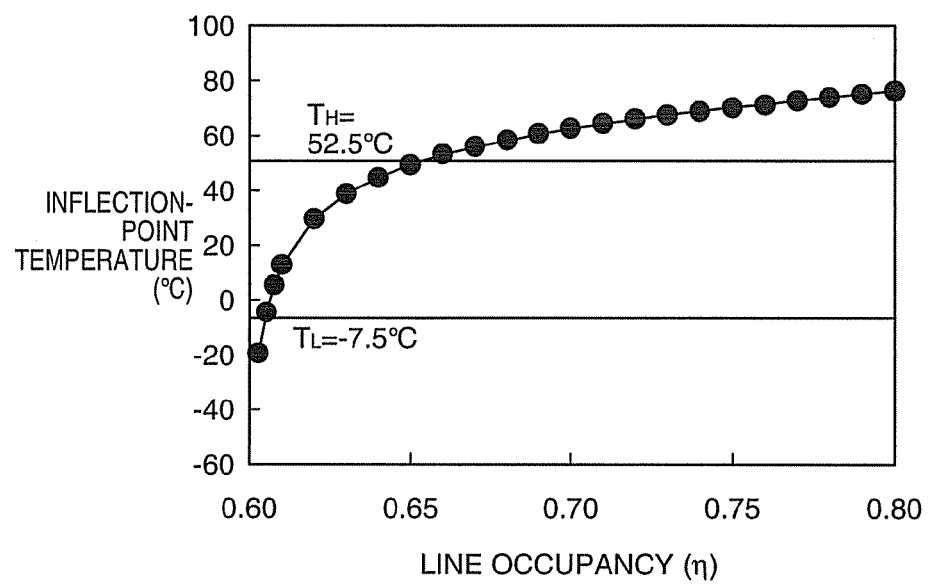
FIG. 11 is a diagram showing the relationship between an IDT line occupancy η and an inflection-point temperature in an example of a SAW resonator according to the invention.

As will be understood from FIG. 11, in this example, the inflection-point temperature changes within the operation temperature range depending on the IDT line occupancy η. In a region where the inflection-point temperature exceeds the above-described upper limit temperature TH=52.5° C., a change in the inflection-point temperature with respect to the IDT line occupancy η is gradual. In a region where the inflection-point temperature does not exceed the lower limit temperature TL=−7.5° C., a change in the inflection-point temperature with respect to the IDT line occupancy η is steep. Meanwhile, in the target temperature range of the lower limit temperature TL=−7.5° C. to the upper limit temperature TH=52.5° C., a change in the inflection-point temperature has a slope which is controllable depending on the IDT line occupancy η with comparatively satisfactory precision.

Figure 12:
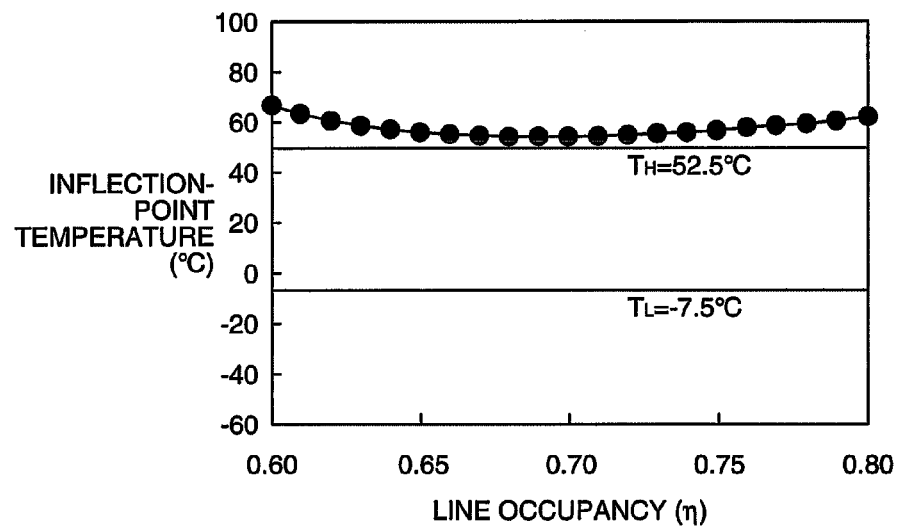
FIG. 12 is a diagram showing the relationship between an IDT line occupancy η and an inflection-point temperature in a SAW resonator with no inter-electrode-finger grooves.

For comparison, in a quartz crystal resonator having the configuration as that in FIG. 11, except that the thickness of the electrode fingers of the IDT is set to 0.08, (8% λ) comparable to the effective thickness 0.07λ (7% λ) of FIG. 11, and no inter-electrode-finger grooves are provided, the relationship between the IDT line occupancy η and the inflection-point temperature of the frequency-temperature characteristic was calculated by a simulation in a range of η=0.6 to 0.8. The result is shown in FIG. 12. From FIG. 12, it is understood that, in the comparative example, the inflection-point temperature is substantially constant and undergoes little change with respect to the IDT line occupancy η.

From the simulation result of FIG. 11, the value of the IDT line occupancy η with respect to the inflection-point temperature can be approximately numerically expressed. When the inflection-point temperature is x, and the IDT line occupancy η is y, the approximate expression is expressed as follows.

$$y = ax^6 + bx^5 + cx^4 + dx^3 + ex^2 + fx + 0.606$$

(where $a=-2.60\times10^{-12}, b=4.84\times10^{-10}, c=2.13\times10^{-8}$,
$d=1.98\times10^{-7}, e=1.42\times10^{-5}, f=1.48\times10^{-4}$) (4)

Figure 13:
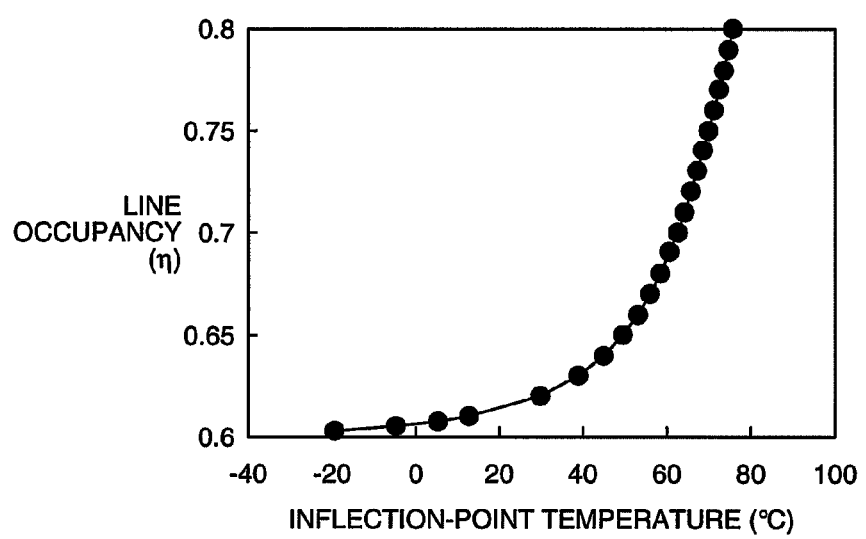
FIG. 13 is a diagram showing a change in an IDT line occupancy η depending on an inflection-point temperature by an approximate curve in this example.

Expression (4) is expressed by an approximate curve of FIG. 13 in which the horizontal axis x is the inflection-point temperature, and the vertical axis y is the IDT line occupancy η.

In Expression (4), if the center temperature Tc of the operation temperature range is substituted into x, the IDT line occupancy η corresponding to the center temperature Tc serving as the inflection-point temperature. When the allowable temperature region relating to the center temperature Tc is ±t (°), if (Tc+t) is substituted into x of Expression (4), the IDT line occupancy η corresponding to the upper limit temperature TH of the target temperature range is obtained. If (Tc−t) is substituted into x of Expression (4), the IDT line occupancy η corresponding to the lower limit temperature TL of the target temperature range is obtained. Although in this example, the same allowable temperature region is set on the upper limit side and the lower limit side, different values may be set on the upper limit side and the lower limit side.

As shown in FIG. 11, when the allowable temperature region is t=30°, the upper limit temperature of the target temperature range is TH=Tc+30(°), and the lower limit temperature is TL=Tc−30(°). In this case, the range of the IDT line occupancy η corresponding to the target temperature range is determined by Expression (4) and Relational Expression (5).

$$a(Tc-30)^6+b(Tc-30)^5+c(Tc-30)^4+d(Tc-30)^3+e(Tc-30)^2+f(Tc-30)+0.606 \leq \eta \leq a(Tc+30)_6+b(Tc+30)^5+c(Tc+30)^4+d(Tc+30)^3+e(Tc+30)^2+f(Tc+30)+0.606 \quad (5)$$

The coefficients a to f are the same as those in Expression (4).

When the SAW resonator 1 of this example has a frequency-temperature characteristic which is expressed by a cubic curve having an inflection point between a maximum value and a minimum value, the influence of a change in the inflection-point temperature on the frequency-temperature characteristic was verified. When the Euler angles of the quartz crystal substrate 2 are set to (0°, 123°, ψ), and the thickness H of the electrode fingers of the IDT 3 is 0.02λ (2% λ), the depth G of the inter-electrode-finger grooves is 0.02λ (2% λ), and the IDT line occupancy η is 0.69, the inflection-point temperature changed in a range of −71° C. to +119° C. at 10° C. intervals, and a frequency-temperature characteristic was calculated by a simulation.

Figure 15A:
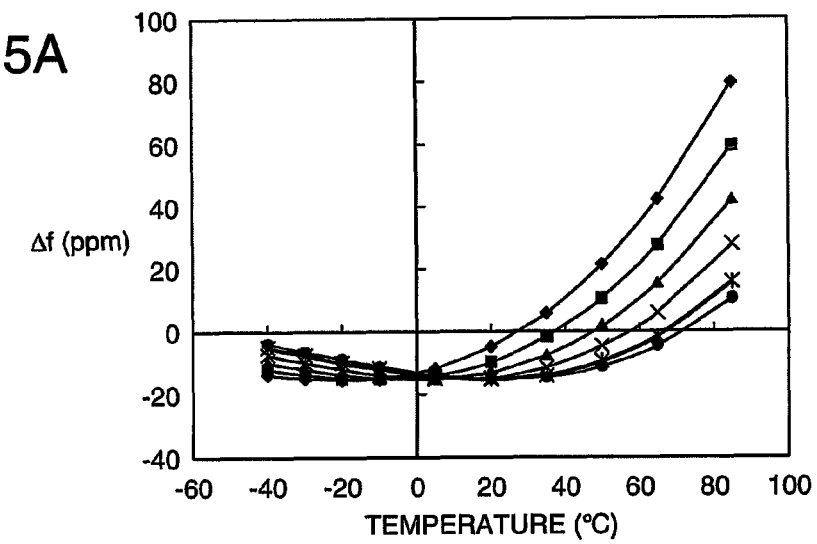
FIGS. 15(A) to 15(C) are diagrams showing changes in a frequency-temperature characteristic corresponding to the range of three different inflection-point temperatures of Table 2.
Figure 15B:
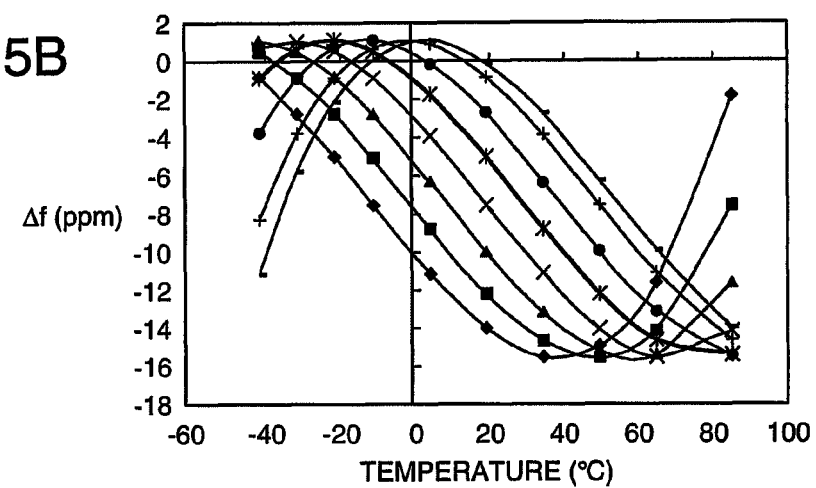
Figure 15C:
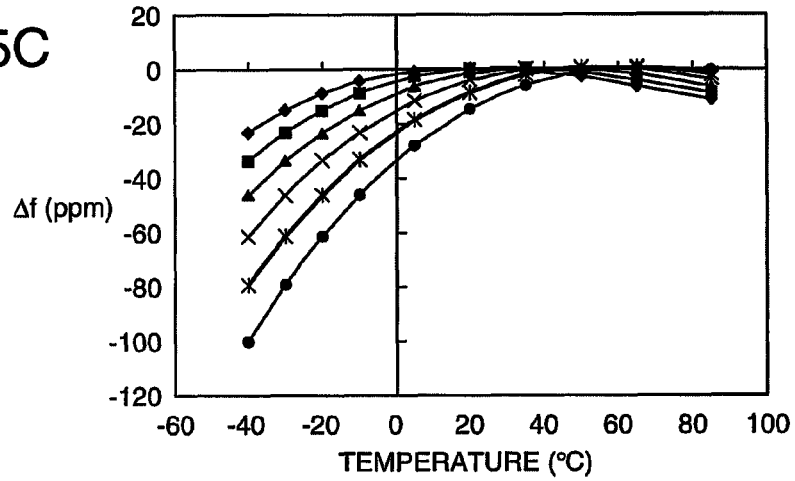

From the resultant simulation result, for each frequency-temperature characteristic, an inflection-point temperature Fp and a frequency fluctuation deviation Δf (ppm) were computed. The computation result is as shown in Table 2.

temperature in a range of −11° C. to +54° C. in Table 2, and FIG. 15(C) shows a frequency-temperature characteristic at an inflection-point temperature in a range of +69° C. to +119° C. As shown in FIGS. 15(A) and (C), if the inflection-point temperature is outside the target temperature range, the frequency-temperature characteristic is significantly deteriorated.

In FIG. 15(B), in all cases, the frequency fluctuation is within 20 ppm, and a satisfactory frequency-temperature characteristic is shown. The range of the inflection-point temperature of FIG. 15(B) is somewhat wider than the upper limit TH=52.5° C. and the lower limit TL=−7.5° C. of the target temperature range. From this, it is understood that, even when the target temperature range is expanded in a wider range than the allowable temperature region (±30° C.) set with respect to the target temperature, that is, the center temperature of the operation temperature range, the frequency fluctuation can be suppressed to be small.

From the results, it is preferable to optimally determine the target temperature range, that is, the target temperature, the upper limit temperature, and the lower limit temperature from a change amount in the frequency fluctuation deviation relat-

TABLE 2

| Temp. (° C.) | Inflection-Point Temperature Fp (° C.) | | | | | | | | | | |
|---|---|---|---|---|---|---|---|---|---|---|---|
| | −71 | −61 | −51 | −41 | −31 | −26 | −11 | −1 | 9 | 19 | 29 |
| −40 | −14 | −12 | −10 | −7 | −5 | −4 | −1 | 1 | 1 | 1 | −1 |
| −30 | −15 | −14 | −12 | −10 | −7 | −6 | −3 | −1 | 1 | 1 | 1 |
| −20 | −16 | −15 | −14 | −12 | −10 | −9 | −5 | −3 | −1 | 1 | 1 |
| −10 | −15 | −16 | −15 | −14 | −12 | −11 | −7 | −5 | −3 | −1 | 1 |
| 5 | −12 | −14 | −15 | −15 | −15 | −14 | −11 | −9 | −6 | −4 | −2 |
| 20 | −5 | −10 | −13 | −15 | −16 | −15 | −14 | −12 | −10 | −7 | −5 |
| 35 | 6 | −2 | −8 | −12 | −14 | −15 | −15 | −15 | −13 | −11 | −9 |
| 50 | 21 | 10 | 2 | −5 | −10 | −12 | −15 | −16 | −15 | −14 | −12 |
| 65 | 42 | 28 | 16 | 6 | −2 | −5 | −12 | −14 | −15 | −15 | −15 |
| 85 | 79 | 59 | 42 | 28 | 16 | 10 | −2 | −8 | −12 | −14 | −15 |
| Δf (ppm) | 95 | 75 | 57 | 43 | 31 | 26 | 15 | 16 | 17 | 17 | 17 |

| Temp. (° C.) | Inflection-Point Temperature Fp (° C.) | | | | | | | | |
|---|---|---|---|---|---|---|---|---|---|
| | 39 | 49 | 54 | 69 | 79 | 89 | 99 | 109 | 119 |
| −40 | −4 | −8 | −11 | −23 | −33 | −46 | −61 | −79 | −100 |
| −30 | −1 | −4 | −6 | −14 | −23 | −33 | −46 | −61 | −79 |
| −20 | 1 | −1 | −2 | −8 | −14 | −23 | −33 | −46 | −61 |
| −10 | 1 | 1 | 0 | −4 | −8 | −14 | −23 | −33 | −46 |
| 5 | 0 | 1 | 1 | 0 | −2 | −6 | −11 | −18 | −28 |
| 20 | −3 | −1 | 0 | 1 | 1 | −1 | −4 | −8 | −14 |
| 35 | −6 | −4 | −3 | 0 | 1 | 1 | 0 | −2 | −6 |
| 50 | −10 | −7 | −6 | −3 | −1 | 1 | 1 | 1 | −1 |
| 65 | −13 | −11 | −10 | −6 | −4 | −2 | 0 | 1 | 1 |
| 85 | −15 | −15 | −14 | −11 | −9 | −6 | −4 | −2 | 0 |
| Δf (ppm) | 17 | 16 | 15 | 24 | 34 | 47 | 62 | 80 | 101 |

Figure 14:
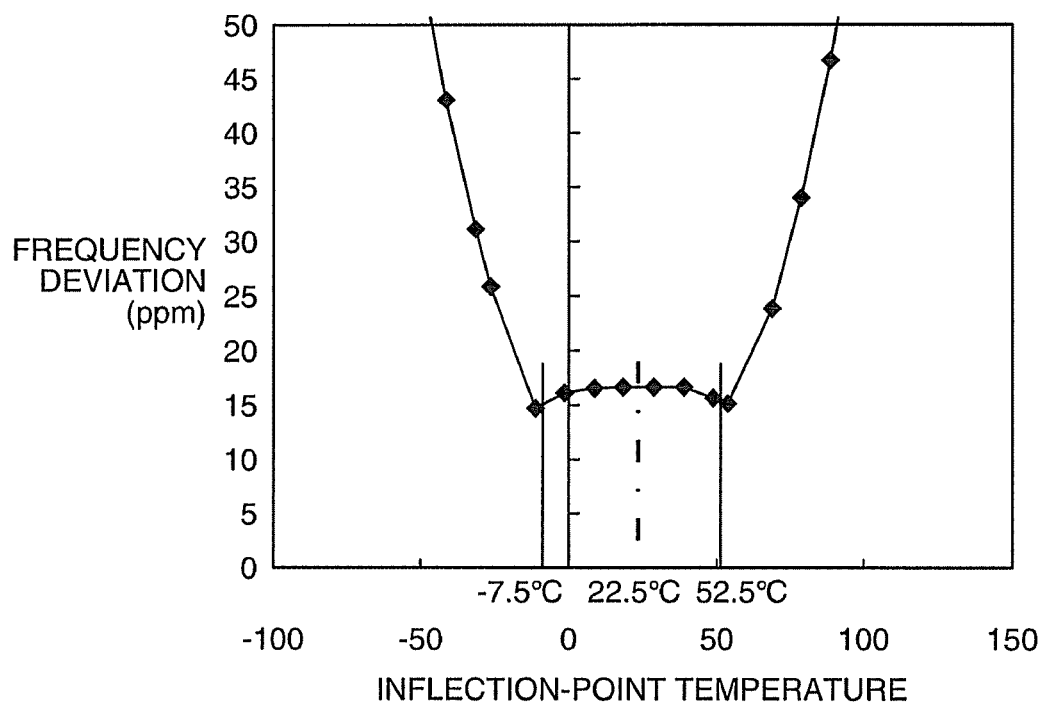
FIG. 14 is a diagram showing the relationship between an inflection-point temperature and a frequency fluctuation deviation in this example.

FIG. 14 shows the relationship between an inflection-point temperature and a frequency fluctuation deviation shown in Table 2. In FIG. 14, the frequency fluctuation deviation is stabilized within the target temperature range (−7.5° C. to 52.5° C.) and has a low value of about 15 to 17 ppm. Meanwhile, if the inflection-point temperature somewhat exceeds the upper limit temperature and lower limit temperature of the target temperature range, the frequency fluctuation deviation changes to increase steeply.

FIG. 15(A) to (C) show changes in a frequency-temperature characteristic corresponding to inflection-point temperatures of FIG. 14. FIG. 15(A) shows a frequency-temperature characteristic at an inflection-point temperature in a range of −71° C. to −26° C. in Table 2. Similarly, FIG. 15(B) shows a frequency-temperature characteristic at an inflection-point ing to the inflection-point temperature. In particular, the inflection-point temperature is set as the center temperature of the operation temperature range, the frequency-temperature characteristic is rotationally symmetric, and the frequency fluctuation can be minimized, thereby obtaining the best frequency-temperature characteristic.

According to this example, a SAW resonator is obtained which has a frequency-temperature characteristic expressed by a cubic curve having a maximum value, a minimum value, and an inflection point between the maximum value and the minimum value, and in which the inflection-point temperature is adjustable depending on the IDT line occupancy η so as to be within the target temperature range. At this time, the target temperature range is optimally selected from the relationship between the inflection-point temperature and the frequency fluctuation deviation. Thus, even when the inflection-point temperature changes, there is no case where the frequency-temperature characteristic deteriorates. Therefore, it is possible to optimally control the frequency-temperature characteristic, which is basically determined by the cut angle of the quartz crystal substrate to be used, depending on the IDT line occupancy η in correspondence with a required operation temperature characteristic, a manufacturing variation, or the like.

With regard to the SAW resonator of this example, similarly to the SAW resonator of this embodiment, it is preferable that the line occupancy η of the IDT 3 is set to satisfy the following relationship.

$$\eta = -1963.05 \times (G/\lambda)^3 + 196.28 \times (G/\lambda)^2 - \\ 6.53 \times (G/\lambda) - 135.99 \times (H/\lambda)^2 + \\ 5.817 \times (H/\lambda) + 0.732 - 99.99 \times (G/\lambda) \times (H/\lambda)$$

[Equation 8]

Thus, it is possible to suppress the secondary temperature coefficient of the frequency-temperature characteristic to be smaller, and thus to further reduce a frequency fluctuation, thereby obtaining a more excellent frequency-temperature characteristic of a cubic curve.

In the SAW resonator of this example, similarly to the SAW resonator of this embodiment, it is preferable that the sum of the depth G of the inter-electrode-finger grooves 8 and the thickness H of the electrode fingers 6a and 6b is set to satisfy $0.0407\lambda \le G+H$. Thus, in this example which uses resonance in the stopband upper end mode, a high Q value is obtained compared to the SAW resonator of the related art which uses resonance in the stopband lower end mode with no grooves between the electrode fingers of the IDT.

Figure 16A:
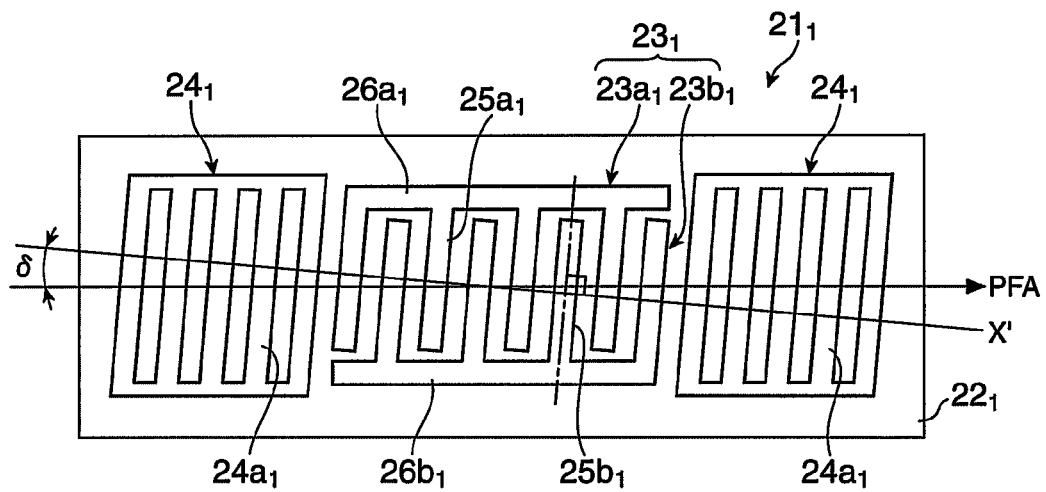
FIGS. 16(A) and 16(B) are plan views showing SAW resonators having inclined IDTs of different structures according to a second example of the invention.

FIGS. 16(A) and (B) show a second example of SAW resonators having inclined IDTs according to the invention. As in the first example, a SAW resonator 21$_1$ of FIG. 16(A) has an inclined IDT 23$_1$ and a pair of reflectors 24$_1$ and 24$_1$ on the principal surface of a quartz crystal substrate 22$_1$ having Euler angles ($-1.5° \le \phi \le 1.5°$, $117° \le \theta \le 142°$, $42.79° \le |\psi| \le 49.57°$). The quartz crystal substrate 22$_1$ is such that the longitudinal direction thereof is aligned in a direction inclined by a power flow angle (PFA) δ° in the propagation direction of energy with respect to the X' axis which is the propagation direction of the phase velocity of the SAW excited by the IDT 23$_1$.

The IDT 23$_1$ has a pair of interdigital transducers 23a$_1$ and 23b$_1$ which respectively have a plurality of electrode fingers 25a$_1$ and 25b$_1$, and bus bars 26a$_1$ and 26b$_1$ connecting the base portions of the electrode fingers. A pair of reflectors 24$_1$ and 24$_1$ are arranged on both sides of the IDT 23$_1$ with the IDT sandwiched therebetween along the SAW propagation direction, and respectively have a plurality of conductor strips 24a$_1$ and 24a$_1$ arranged in the SAW propagation direction. The electrode fingers 25a$_1$ and 25b$_1$ and the conductor strips 24a$_1$ are arranged such that the extension direction thereof is perpendicular to the X' axis inclined at the power flow angle (PFA) δ°.

As in the first example, inter-electrode-finger grooves are recessed in the surface of the quartz crystal substrate 22$_1$ exposed between the electrode fingers 25a$_1$ and 25b$_1$. Similarly, inter-conductor-strip grooves are recessed in the surface of the quartz crystal substrate 22$_1$ between the conductor strips 24a$_1$ and 24a$_1$.

If at least a part of the IDT and the reflectors is arranged in a direction intersecting the X'-axis direction at the power flow angle δ, the SAW device 21$_1$ exhibits the same functional effects as in the first example, thereby further increasing the Q value. Thus, a lower-loss SAW resonator is realized.

Figure 16B:
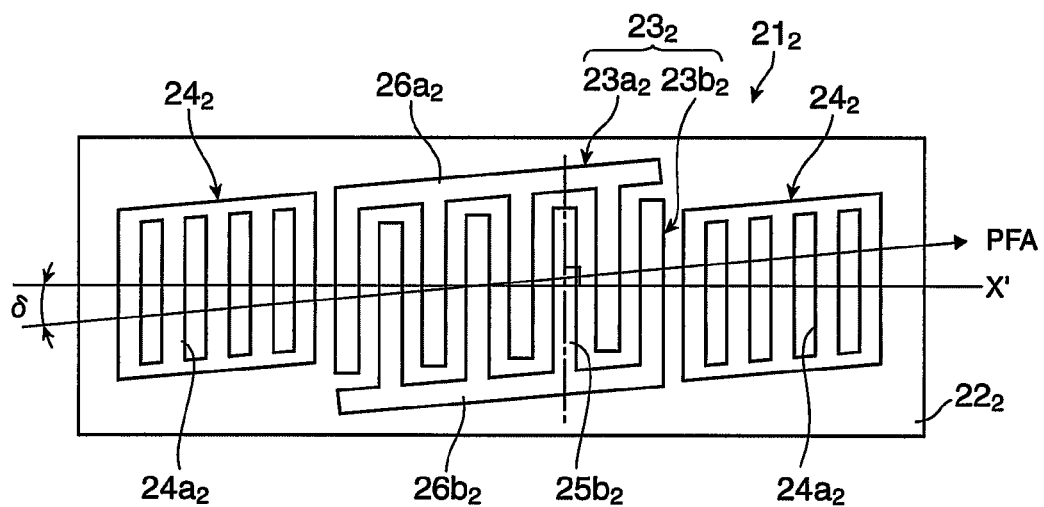

A SAW resonator 21$_2$ of FIG. 16(B) has an inclined IDT 23$_2$ and a pair of reflectors 24$_2$ and 24$_2$ having a different configuration from FIG. 16(A) on the principal surface of the quartz crystal substrate 22$_2$. The quartz crystal substrate 22$_2$ is such that the longitudinal direction thereof is aligned along the X' axis which is the propagation direction of the phase velocity of the SAW excited by the IDT 23$_2$.

The IDT 23$_2$ has a pair of interdigital transducers 23a$_2$ and 23b$_2$ which respectively have a plurality of electrode fingers 25a$_2$ and 25b$_2$, and bus bars 26a$_2$ and 26b$_2$ connecting the base portions of the electrode fingers. A pair of reflectors 24$_2$ and 24$_2$ are arranged on both sides of the IDT 23$_2$ with the IDT sandwiched therebetween along the SAW propagation direction, and respectively have a plurality of conductor strips 24a$_2$ and 24a$_2$ arranged in the SAW propagation direction. The electrode fingers 25a$_2$ and 25b$_2$ and the conductor strip 24a$_2$ are arranged such that the extension direction thereof is perpendicular to the X' axis, and the bus bars 26a$_2$ and 26b$_2$ are aligned in a direction inclined at the power flow angle (PFA) δ° from the X' axis.

As in the first example, inter-electrode-finger grooves are recessed in the surface of the quartz crystal substrate 22$_2$ exposed between the electrode fingers 25a$_2$ and 25b$_2$. Similarly, inter-conductor-strip grooves are recessed in the surface of the quartz crystal substrate 22$_2$ between the conductor strips 24a$_2$ and 24a$_2$.

In the SAW resonator 21$_2$ of this example, if at least a part of the IDT and the reflectors is arranged in a direction intersecting the X'-axis direction at the power flow angle δ in the above-described manner, a functional effect of realizing a satisfactory frequency-temperature characteristic and a high Q value is exhibited, thereby further increasing the Q value. Thus, a lower-loss SAW resonator is realized.

Figure 17A:
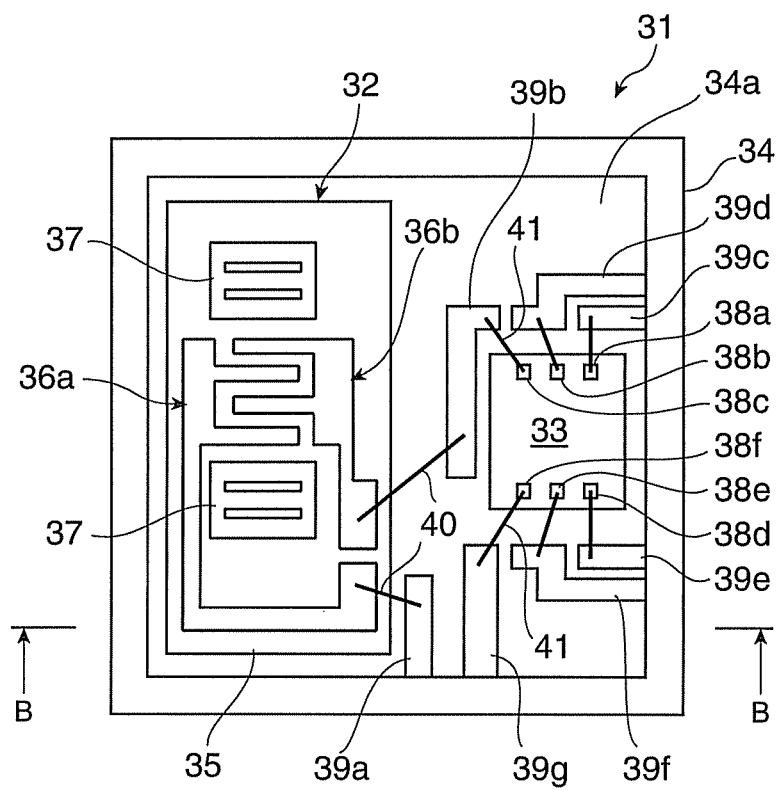
FIG. 17 (A) is a plan view showing a SAW oscillator according to an embodiment of the invention.
FIG. 17(B) is a longitudinal sectional view taken along the line B-B.
Figure 17B:
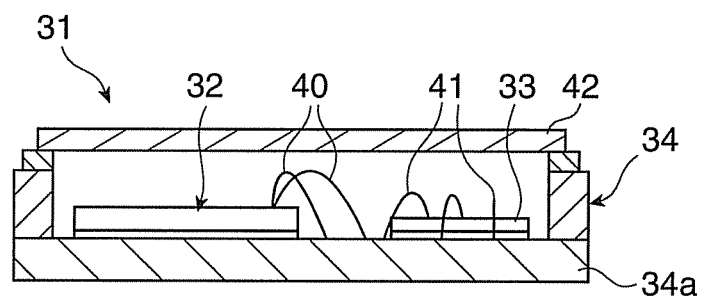

The invention may be applied to an oscillator in which the SAW resonator of this embodiment and an oscillation circuit are incorporated. FIGS. 17(A) and 17(B) show the configuration of an example of a SAW oscillator which is a second example of a SAW device according to the invention. A SAW oscillator 31 of this example includes a SAW resonator 32 of this embodiment, an IC (integrated circuit) 33 which serves as an oscillation circuit to drive and control the SAW resonator, and a package 34 which accommodates the SAW resonator 32 and the IC 33. The SAW resonator 32 and the IC 33 are surface-mounted on a bottom plate 34a of the package 34.

The SAW resonator 32 has the same configuration of the SAW resonator 11 of the first example. The SAW resonator 32 has a quartz crystal substrate 35 which is expressed by the same Euler angles as in the first example, and an IDT having a pair of interdigital transducers 36a and 36b and a pair of reflectors 37 and 37 formed on the surface of the quartz crystal substrate 35. Electrode pads 38a to 38f are provided in the upper surface of the IC 33. Electrode patterns 39a to 39g are formed on the bottom plate 34a of the package 34. The interdigital transducers 36a and 36b of the SAW resonator 32 and the electrode pads 38a to 38f of the IC 33 are electrically connected to the corresponding electrode patterns 39a to 39g by bonding wires 40 and 41. The package 34 in which the SAW resonator 32 and the IC 33 is sealed airtight by a lid 42 bonded to the upper part of the package 34.

The SAW oscillator 31 of this example includes the SAW resonator of this embodiment, and has an excellent frequency-temperature characteristic with a very small frequency fluctuation in a wide operation temperature range and a high Q value. Therefore, it is possible to perform a stable oscillation operation and to realize reduction in power consumption because of low impedance. As a result, a SAW oscillator is obtained which copes with high-frequency and high-precision performance based on recent high-speed information communication, and includes an environment-resistant characteristic such that, even when a temperature varies extremely, a stable operation is ensured for a long period.

The invention is not limited to the foregoing examples, and various modifications or changes may be made within the technical scope. For example, although the SAW resonator of the first example has the reflectors on both sides of the IDT, the invention can also be applied to a SAW resonator with no reflectors. With regard to the electrode structure of the IDT, in addition to the foregoing examples, various known configurations may be used.

The invention may also be applied to a SAW device other than the above-described SAW resonator and SAW oscillator. The SAW device of this embodiment may also be widely applied to various electronic apparatuses, such as a mobile phone, a hard disk, a personal computer, a receiver tuner of BS and CS broadcasts, various processing apparatuses for a high-frequency signal or an optical signal which propagates through a coaxial cable or an optical cable, a server network apparatus which requires high-frequency and high-precision clock (low jitter and low phase noise) in a wide temperature range, various electronic apparatuses such as a wireless communication apparatus, and various sensor apparatuses, such as a pressure sensor, an acceleration sensor, and a rotation speed sensor.

The entire disclosure of Japanese Patent Application No. 2010-201751, filed Sep. 9, 2010 is expressly incorporated by reference herein.

The invention claimed is:

1. A surface acoustic wave device comprising:
a quartz crystal substrate having Euler angles $(-1.5°\leq\phi\leq1.5°, 117°\leq\theta\leq142°, |\psi|\neq90°\times n$ (where n=0, 1, 2, 3)); and
an IDT which has a plurality of electrode fingers on the principal surface of the quartz crystal substrate and excites a Rayleigh wave in a stopband upper end mode, wherein inter-electrode-finger grooves are recessed in the surface of the quartz crystal substrate between adjacent electrode fingers of the IDT,
the wavelength $\lambda$ of the Rayleigh wave and the depth G of the inter-electrode-finger grooves satisfy $0.01\lambda\leq G\leq 0.07\lambda$,
an IDT line occupancy $\eta$ and the depth G of the inter-electrode-finger grooves satisfy the following relationships:

$-2.0000\times G/\lambda+0.7200\leq\eta\leq-2.5000\times G/\lambda+0.7775$ where $0.0100\lambda\leq G\leq 0.0500\lambda$;

$-3.5898\times G/\lambda+0.7995\leq\eta\leq-2.5000\leq G/\lambda+0.7775$ where $0.0500\lambda\leq G\leq 0.0695\lambda$; and a frequency-temperature characteristic is expressed by a curve having a maximum value, a minimum value, and an inflection point between the maximum value and the minimum value, and the temperature of the inflection point is adjustable depending on the IDT line occupancy so as to be within a range of Tc+30° C. to Tc−30° C. from the center temperature Tc of a desired operation temperature range.

2. The surface acoustic wave device according to claim 1, wherein the IDT line occupancy $\eta$ satisfies the following relationship:

$a(Tc-30)^6+b(Tc-30)^5+c(Tc-30)^4+d(Tc-30)^3+e(Tc-30)^2+f(Tc-30)+0.606\leq\eta\leq a(Tc+30)^6+b(Tc+30)^5+c(Tc+30)^4+d(Tc+30)^3+e(Tc+30)^2+f(Tc+30)+0.606$, (where $a=-2.60\times10^{-12}, b=4.84\times10^{-10}, c=-2.13\times10^{-8}, d=1.98\times10^{-7}, e=1.42\times10^{-5}, f=1.48\times10^{-4}$).

3. The surface acoustic wave device according to claim 1, wherein the Euler angle $\psi$ of the quartz crystal substrate is within a range of $42.79°\leq|\psi|\leq 49.57°$.

4. The surface acoustic wave device according to claim 1, wherein the IDT line occupancy $\eta$ satisfies the following relationship:

$\eta=-1963.05\times(G/\lambda)^3+196.28\times(G/\lambda)^2-6.53\times(G/\lambda)$ $-135.99\times(H/\lambda)^2+5.817\times(H/\lambda)+0.732$ $-99.99\times(G/\lambda)\times(H/\lambda)$, where H is a thickness of the electrode fingers.

5. The surface acoustic wave device according to claim 3, wherein the IDT line occupancy satisfies the following relationship:

$\eta=-1963.05\times(G/\lambda)^3+196.28\times(G/\lambda)^2-6.53\times(G/\lambda)$ $-135.99\times(H/\lambda)^2+5.817\times(H/\lambda)+0.732$ $-99.99\times(G/\lambda)\times(H/\lambda)$, where H is a thickness of the electrode fingers.

6. The surface acoustic wave device according to claim 1, wherein the sum of the depth G of the inter-electrode-finger groove and a thickness H of the electrode fingers satisfies $0.0407\lambda\leq G+H$.

7. The surface acoustic wave device according to claim 3, wherein the sum of the depth G of the inter-electrode-finger grooves and a thickness H of the electrode fingers satisfies $0.0407\lambda\leq G+H$.

8. The surface acoustic wave device according to claim 4, wherein the sum of the depth G of the inter-electrode-finger grooves and a thickness H of the electrode fingers satisfies $0.0407\lambda\leq G+H$.

9. The surface acoustic wave device according to claim 1, further comprising:
a pair of reflectors which respectively have a plurality of conductor strips on the principal surface of the quartz crystal substrate and are arranged on both sides of the IDT with the IDT sandwiched therebetween along an SAW propagation direction,
wherein inter-conductor-strip grooves are recessed in the surface of the quartz crystal substrate between adjacent conductor strips of the reflectors,
an angle between a first direction perpendicular to the electrode fingers and the conductor strips and the electrical axis of the quartz crystal substrate is the Euler angle $\psi$ of the quartz crystal substrate,
at least a part of the IDT and the reflectors is arranged in a second direction intersecting the first direction at an angle $\delta$, and
the angle $\delta$ is set to be within a power flow angle ±1° of the quartz crystal substrate.

10. The surface acoustic wave device according to claim 3, further comprising:
a pair of reflectors which respectively have a plurality of conductor strips on the principal surface of the quartz crystal substrate and are arranged on both sides of the IDT with the IDT sandwiched therebetween along an SAW propagation direction, wherein inter-conductor-strip grooves are recessed in the surface of the quartz crystal substrate between adjacent conductor strips of the reflectors, an angle between a first direction perpendicular to the electrode fingers and the conductor strips and the electrical axis of the quartz crystal substrate is the Euler angle $\psi$ of the quartz crystal substrate, at least a part of the IDT and the reflectors is arranged in a second direction intersecting the first direction at an angle δ, and the angle δ is set to be within a range of a power flow angle ±1° of the quartz crystal substrate.

11. The surface acoustic wave device according to claim 4, further comprising:

a pair of reflectors which respectively have a plurality of conductor strips on the principal surface of the quartz crystal substrate and are arranged on both sides of the IDT with the IDT sandwiched therebetween along an SAW propagation direction, wherein inter-conductor-strip grooves are recessed in the surface of the quartz crystal substrate between adjacent conductor strips of the reflectors, an angle between a first direction perpendicular to the electrode fingers and the conductor strips and the electrical axis of the quartz crystal substrate is the Euler angle $\psi$ of the quartz crystal substrate, at least a part of the IDT and the reflectors is arranged in a second direction intersecting the first direction at an angle δ, and the angle δ is set to be within a power flow angle ±1° of the quartz crystal substrate.

12. The surface acoustic wave device according to claim 5, further comprising:

a pair of reflectors which respectively have a plurality of conductor strips on the principal surface of the quartz crystal substrate and are arranged on both sides of the IDT with the IDT sandwiched therebetween along an SAW propagation direction, wherein inter-conductor-strip grooves are recessed in the surface of the quartz crystal substrate between adjacent conductor strips of the reflectors, an angle between a first direction perpendicular to the electrode fingers and the conductor strips and the electrical axis of the quartz crystal substrate is the Euler angle $\psi$ of the quartz crystal substrate, at least a part of the IDT and the reflectors is arranged in a second direction intersecting the first direction at an angle δ, and the angle δ is set to be within a power flow angle ±1° of the quartz crystal substrate.

13. The surface acoustic wave device according to claim 2, wherein the Euler angle γ r of the quartz crystal substrate is within a range of 42.79°≤$\psi$|≤49.57°.

14. The surface acoustic wave device according to claim 2, wherein the IDT line occupancy $r_1$ satisfies the following relationship:

$$\eta = -1963.05 \times (G/\lambda)^3 + 196.28 \times (G/\lambda)^2 - 6.53 \times (G/\lambda)$$

$$-135.99 \times (H/\lambda)^2 + 5.817 \times (H/\lambda) + 0.732$$

$$-99.99 \times (G/\lambda) \times (H/\lambda),$$

where H is a thickness of the electrode fingers.

15. The surface acoustic wave device according to claim 2, wherein the sum of the depth G of the inter-electrode-finger groove and a thickness H of the electrode fingers satisfies 0.0407λ≤G+H.

16. The surface acoustic wave device according to claim 2, further comprising:

a pair of reflectors which respectively have a plurality of conductor strips on the principal surface of the quartz crystal substrate and are arranged on both sides of the IDT with the IDT sandwiched therebetween along an SAW propagation direction, wherein inter-conductor-strip grooves are recessed in the surface of the quartz crystal substrate between adjacent conductor strips of the reflectors, an angle between a first direction perpendicular to the electrode fingers and the conductor strips and the electrical axis of the quartz crystal substrate is the Euler angle $\psi$ of the quartz crystal substrate, at least a part of the IDT and the reflectors is arranged in a second direction intersecting the first direction at an angle δ, and the angle δ is set to be within a power flow angle ±1° of the quartz crystal substrate.

17. The surface acoustic wave device according to claim 1, further comprising:

an IC which drives the IDT.

18. The surface acoustic wave device according to claim 2, further comprising:

an IC which drives the IDT.

19. An electronic apparatus comprising:

the surface acoustic wave device according to claim 1.

20. An electronic apparatus comprising:

the surface acoustic wave device according to claim 2.

21. A sensor apparatus comprising:

the surface acoustic wave device according to claim 1.

22. A sensor apparatus comprising:

the surface acoustic wave device according to claim 2.

* * * * *